United States Patent
Bhushan et al.

(10) Patent No.: US 10,510,946 B2
(45) Date of Patent: Dec. 17, 2019

(54) MRAM CHIP MAGNETIC SHIELDING

(71) Applicant: GLOBALFOUNDRIES Singapore Pte. Ltd., Singapore (SG)

(72) Inventors: Bharat Bhushan, Singapore (SG); Juan Boon Tan, Singapore (SG); Wanbing Yi, Singapore (SG); Danny Pak-Chum Shum, Singapore (SG); Shan Gao, Singapore (SG); Kangho Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 275 days.

(21) Appl. No.: 15/080,562

(22) Filed: Mar. 24, 2016

(65) Prior Publication Data
US 2017/0025471 A1    Jan. 26, 2017

Related U.S. Application Data

(60) Provisional application No. 62/195,807, filed on Jul. 23, 2015.

(51) Int. Cl.
*H01L 43/02* (2006.01)
*H01L 43/12* (2006.01)

(52) U.S. Cl.
CPC ............. *H01L 43/02* (2013.01); *H01L 43/12* (2013.01)

(58) Field of Classification Search
CPC ... H01L 23/552; H01L 27/222; H01L 27/226; H01L 27/228; H01L 43/02; H01L 43/12
See application file for complete search history.

(56) References Cited

U.S. PATENT DOCUMENTS

| | | | |
|---|---|---|---|
| 7,545,662 B2 | 6/2009 | Wang et al. | |
| 7,772,679 B2 | 8/2010 | Chang et al. | |
| 8,796,046 B2 | 8/2014 | Chen et al. | |
| 9,252,108 B2 | 2/2016 | Fujimori | |
| 2006/0289970 A1 | 12/2006 | Gogl et al. | |
| 2010/0254182 A1 | 10/2010 | Kuroiwa et al. | |
| 2011/0198715 A1* | 8/2011 | Matsuoka | G11C 11/16 257/421 |
| 2011/0241140 A1 | 10/2011 | Tsujiuchi et al. | |
| 2012/0193737 A1 | 8/2012 | Pang et al. | |
| 2013/0249024 A1 | 9/2013 | Saida et al. | |
| 2014/0001585 A1 | 1/2014 | Dimitrov et al. | |
| 2014/0264679 A1 | 9/2014 | Lee et al. | |

(Continued)

*Primary Examiner* — Hoang-Quan T Ho
*Assistant Examiner* — Scott Stowe
(74) *Attorney, Agent, or Firm* — Thompson Hine LLP

(57) ABSTRACT

Emerging memory chips and methods for forming an emerging memory chip are presented. For example, magnetic random access memory (MRAM) chip magnetic shielding and methods of forming a magnetic shield processed at the wafer-level are disclosed. The method includes providing a magnetic shield at the front side of the chip, back side of the chip, and also in the deep trenches surrounding or adjacent to magnetic tunnel junction (MTJ) array within the prime die region. Magnetic shield in the deep trenches connects front side and back side magnetic shield. This magnetic shielding method is applicable for both in-plane and perpendicular MRAM chips. The MTJ array is formed in the prime die region and in between adjacent inter layer dielectric (ILD) levels of the upper ILD layer in the back end of line (BEOL) of the MRAM chip.

16 Claims, 28 Drawing Sheets

(56) References Cited

U.S. PATENT DOCUMENTS

| | | |
|---|---|---|
| 2015/0091109 A1 | 4/2015 | Allinger et al. |
| 2015/0243607 A1* | 8/2015 | Jang .................. H01L 24/73 |
| | | 438/113 |
| 2015/0333018 A1 | 11/2015 | Kim et al. |
| 2016/0093796 A1 | 3/2016 | Arai |
| 2016/0172580 A1 | 6/2016 | Matsubara et al. |

* cited by examiner

MRAM CHIP MAGNETIC SHIELDING

CROSS-REFERENCE TO RELATED APPLICATIONS

This application claims the priority benefit of U.S. Provisional Application Ser. No. 62/195,807, filed on Jul. 23, 2015, and this application cross-references to U.S. patent application Ser. No. 15/080,541, concurrently filed on Mar. 24, 2016, the disclosures of which are hereby incorporated by reference in their entireties for all purposes.

BACKGROUND

Magnetic random access memory (MRAM) is a non-volatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. For example, READ and WRITE operations of the MRAM device rely on the MTJ element. However, magnetic interferences can be a problem for MRAM devices. For instance, MTJ functions can be affected by an external magnetic field. The external magnetic field may come from sources of magnetic flux such as power lines, bar magnets, or the earth. The external magnetic fields not only distort magnetic signals within the MTJ memory, but also induce changes on electrical signals of the circuits. READ and WRITE operations in MRAM devices are inevitably affected by external magnetic fields. These cause reliability issues in MRAM devices.

Accordingly, it is desirable to provide reliable and cost effective wafer-level processing of magnetic shielding techniques to protect the MRAM chip from external magnetic fields. For certain applications, such as chip card, package level magnetic shielding may not be applicable due to package thickness (form factor) constraint. As such, there is a need for a die or chip-level magnetic shielding processed at, for example, the wafer-level.

SUMMARY

Embodiments of the present disclosure generally relate to MRAM chips or dies with magnetic shield protection layers and methods of forming thereof. In one embodiment, a method for forming a MRAM chip is disclosed. The method includes providing a substrate having first and second surfaces. The first surface is defined with a prime die region and the second surface of the substrate defines a back side of the MRAM chip. An upper inter level dielectric (ILD) layer is formed over the first surface of the substrate. The upper ILD layer includes a plurality of ILD levels. A magnetic storage element having a magnetic tunneling junction (MTJ) array with MTJ stack is formed in the prime die region and in between adjacent ILD levels of the upper ILD layer. A pad level is formed over the magnetic storage element. The pad level includes a die bond/bump pad coupled to the magnetic storage element and the pad level defines a front side of the MRAM chip. At least a front side magnetic shield layer is formed over at least a portion of the front side of the MRAM chip.

In another embodiment, a method for forming a MRAM chip is presented. The method includes providing a wafer chip having a wafer substrate with first and second surfaces. The first surface of the wafer substrate is defined with prime die regions and scribe/saw lane regions surrounding the prime die regions, and the second surface of the wafer substrate defines a back side of the wafer substrate. The wafer is processed. Processing the wafer includes performing back end of line processing to form an upper inter level dielectric (ILD) layer over the first surface of the wafer substrate. The upper ILD layer includes a plurality of ILD levels. One or more magnetic storage elements having a magnetic tunneling junction (MTJ) array with MTJ stack are formed in the prime die regions and in between adjacent ILD levels of the upper ILD layer. A pad level is formed over the one or more magnetic storage elements. The pad level includes a die bond/bump pad coupled to the magnetic storage element and the pad level defines a front side of the wafer. At least a front side magnetic shield layer is formed over at least a portion of the front side of the wafer. The wafer is separated into a plurality of individual MRAM chips. An individual MRAM chip includes front side magnetic shield, sidewall/spacers magnetic shield, lateral magnetic shield and/or back side magnetic shield. The magnetic shield layer is formed over at least a portion of the front side of the MRAM chip.

In yet another embodiment, a MRAM chip is disclosed. The MRAM chip includes a substrate having first and second surfaces. The first surface is defined with a prime die region and the second surface of the substrate defines a back side of the MRAM chip. An upper inter level dielectric (ILD) layer is disposed over the first surface of the substrate. The upper ILD layer includes a plurality of ILD levels. A magnetic storage element having a magnetic tunneling junction (MTJ) array with MTJ stack is disposed in the prime die region and in between adjacent ILD levels of the upper ILD layer. A pad level is disposed over the magnetic storage element. The pad level includes a die bond/bump pad coupled to the magnetic storage element and the pad level defines a front side of the MRAM chip. At least a magnetic shield layer is disposed over at least a portion of the front side of the MRAM chip.

In some embodiments, the method may include forming sidewall magnetic shielding in the scribe region of the wafer. In such case, the MRAM chip includes front side magnetic shield formed on the front side and sidewall magnetic shield formed at the sidewall of the MRAM chip. In some embodiments, the sidewall magnetic shielding may be in the form of magnetic shield spacers. In some other embodiments, the method may include forming lateral magnetic shield surrounding or adjacent to the array of MTJs disposed in the prime die region. Back side magnetic shield may also be formed at the back surface of the MRAM chip after wafer thinning.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which.

DETAILED DESCRIPTION

Embodiments of the present disclosure generally relate to MRAM chips or dies and methods for forming MRAM chips having chip-level magnetic shield protections processed at the wafer-level. The MRAM chip or die, for example, may be spin transfer torque magnetic random access memory (STT-MRAM) chip. The MRAM chip includes MRAM cell having a MTJ element. Other suitable types of memory chips may also be useful. The MRAM chip as will be described later in this disclosure includes one or more magnetic shield protection layers disposed in or on different locations of the chip such that the MRAM chip is protected against external magnetic interferences to prevent disturbance or change of spins in the magnetic storage element of the MRAM chip. Such MRAM chips or dies can be incorporated into standalone memories or embedded memories including, but not limited to, USB or other types of portable storage units, or ICs, such as microcontrollers or system on chips (SoCs). The devices or ICs may be incorporated into or used with, for example, consumer electronic products, or related to other types of gadgets.

Figure 1:
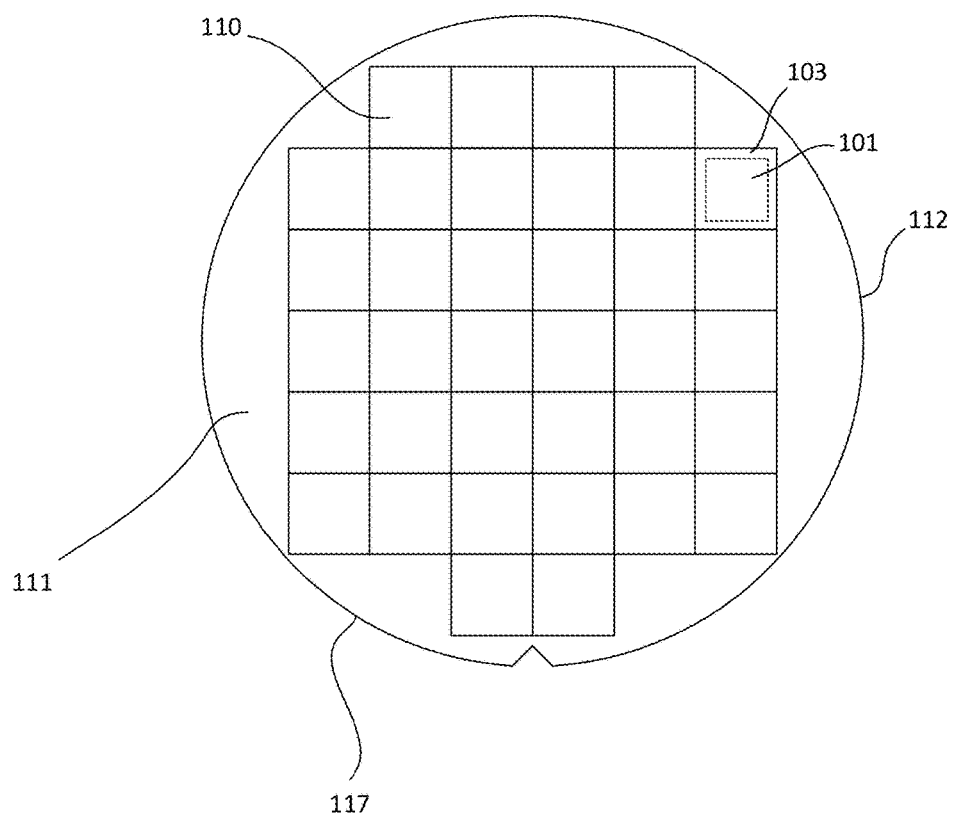
FIG. 1 shows a simplified plan view of an embodiment of a processed MRAM wafer.

FIG. 1 shows a simplified plan view of an embodiment of a MRAM wafer 117. The MRAM wafer, for example, may be a silicon wafer. Other suitable types of wafers are also useful. For example, the wafer may be a p-type or n-type doped wafer. The wafer includes a first surface 111 which may be referred to as a front side of the wafer on which a plurality of dies 110 are formed and a second surface 112 which may be referred to as a back side of the wafer. The plurality of dies may be formed on the wafer in parallel. The dies, for example, are arranged in rows along a first (x) direction and columns along a second (y) direction. The wafer, as shown, are defined with prime die regions 101 and scribe/saw lane regions 103. The prime die region includes design features and interconnections of the die. For example, the prime die region includes a MRAM cell array region where MTJ bits or elements are disposed. As for the scribe region, it surrounds the prime die region. The scribe region, for example, serves as the scribe lanes or dicing channels on the wafer, separating adjacent dies. A singulation process may be performed to separate the wafer into individual MRAM dies or chips 110 through the dicing channels 103.

Figure 2A:
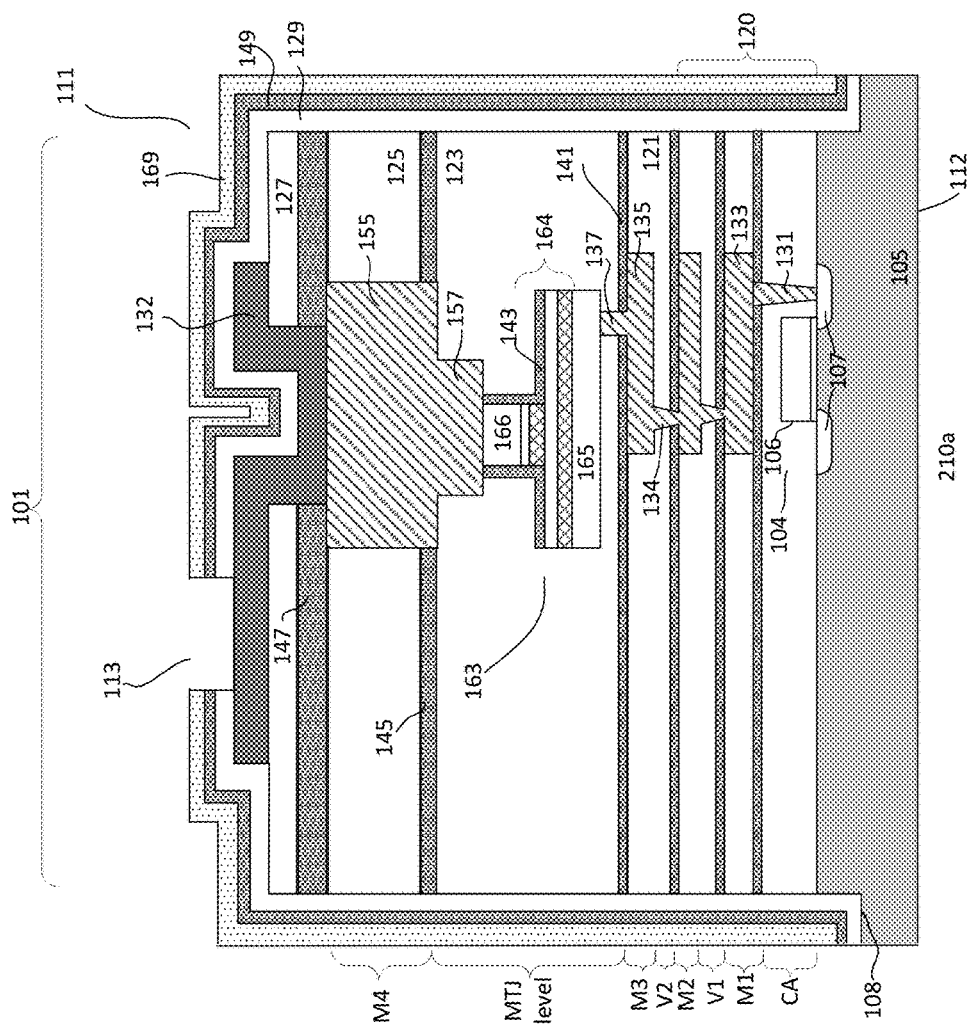
FIGS. 2a-2b show exemplary cross-sectional views of embodiments of MRAM chip with front side and sidewall magnetic shields.

FIG. 2a shows a cross-sectional view of an embodiment of a singulated or individual MRAM chip or die 210a. The MRAM chip, for example, includes a MRAM cell such as a NVM cell. The MRAM cell, in one embodiment, is a STT-MRAM cell having MTJ bit element. Other suitable type of memory cell may also be useful.

The cross-sectional view, for example, is taken along a MRAM region which is part of the prime die region 101 of the die. The MRAM cell, for example, is disposed in the MRAM region of a substrate. The MRAM region, for example, may be an array region. For example, the array region may include a plurality of MRAM cell regions. For simplicity and illustration purpose, only one MTJ bit from an array of bits is shown. The substrate may include other types of device regions (not shown in this cross-sectional view), such as logic, high voltage (HV), low voltage (LV) and intermediate voltage (IV) device regions. Other types of regions may also be provided.

As described, the MRAM cell is disposed on a substrate 105. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon dioxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material. The substrate may be a part of the wafer 117 as described in FIG. 1 which is processed in parallel to form a plurality of dies.

The substrate includes a first (front side) surface and a second (back side) surface 112. Front end of line (FEOL) processing is performed on the first surface of the substrate. The FEOL process, for example, forms n-type and p-type transistors in the MRAM region as well as other regions on the substrate. The p-type and n-type transistors, for example, may include complementary MOS (CMOS) transistors and cell selector units. The FEOL processing, for example, includes forming isolation regions, various device and isolation wells, transistor gates and transistor source/drain (S/D) regions and contact or diffusion regions serving as substrate or well taps. Forming other components with the FEOL process may also be useful. For simplicity, only one transistor 104 and its gate 106 and S/D regions 107 are shown.

After the FEOL processing, back end of line (BEOL) processing is performed. The BEOL processing includes forming interconnects in interlevel dielectric (ILD) layers over the first surface of the substrate. The interconnects connect the various components of the integrated circuit (IC) to perform the desired functions. An ILD level includes a metal level and a via level. Generally, the metal level includes conductors or metal lines while the via level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A die may include a plurality of ILD layers or levels. For example, x number of ILD levels may be provided. As illustrated, the die includes 4 ILD levels (x=4). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be, for example, silicon dioxide formed by chemical vapor deposition (CVD). The dielectric layer serves as a premetal dielectric layer or first contact layer of the BEOL process. The dielectric layer may be referred to as CA level of the BEOL process. Contacts 131 are formed in the CA level dielectric layer by using mask and etch techniques. A conductive layer, such as tungsten may be deposited on the substrate by sputtering.

Conductive lines 133 are formed in the M1 level dielectric layer over the CA level. The conductive lines may be formed by a damascene technique using, for example, mask and etch techniques. The conductive material such as copper or copper alloy may be formed by, for example, plating, such as electro or electroless plating. The first metal level M1 and CA may be referred as a lower ILD level.

The process continues to form additional ILD layers or upper ILD layers/levels. The additional ILD levels may include ILD level 2 to ILD level x. For example, in the case where x=4 (4 levels), the additional levels include ILD levels from 2 to 4, which includes metal levels M2 to M4 and via levels V1 to V3. The number of ILD layers may depend on, for example, design requirements or the logic process involved. The ILD layers may be formed of silicon dioxide. Other types of dielectric materials, such as low k, or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, PVD and plating techniques. Excess conductive material is removed by, for example, CMP, forming conductors and contacts in an ILD layer.

For simplicity and for illustration purpose, the ILD layers from CA level to M2 level may be collectively referred to as lower ILD layers 120 and dielectric liners, such as NBLoK, may be disposed in between adjacent ILD layers. As shown, a dielectric layer 121 is disposed over the lower ILD layers 120. For illustration purpose, the dielectric layer 121 may be referred to as a first upper dielectric layer and corresponds to ILD level 3. The ILD level 3, for example, includes a via level and a metal level. The ILD level 3, for example, includes via level V2 and metal level M3. One or more via contacts 134 may be disposed in V2 while one or more metal lines 135 may be disposed in M3. The metal line 135, for example, includes a conductive material, such as Cu.

A dielectric liner 141 is disposed over the first upper dielectric layer 121 covering the metal line 135. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second upper dielectric layer 123 is disposed on the first upper dielectric layer 121 with the dielectric liner 141 in between. The second upper dielectric layer, in one embodiment, is Tetraethyl orthosilicate (TEOS). Any suitable dielectric materials and thicknesses for the second upper dielectric layer may be useful. The second upper dielectric layer, for example, may be a dielectric stack having one or more dielectric layers. A via plug 137, for example, may be disposed in the second upper dielectric layer 123 extending through the dielectric liner 141 and is coupled to the metal line 135. The via plug, for example, includes a conductive material, such as Cu. Other suitable types of conductive material may also be useful.

As shown in FIG. 2a, the MRAM region accommodates a magnetic storage element 163 to form a MTJ bit cell, such as a STT-MRAM cell. In one example, the magnetic storage element is disposed in ILD level 4. ILD level 4, for example, includes a MTJ level and metal level M4. The magnetic storage element, as shown, is disposed in a dielectric layer between adjacent metal levels of upper ILD level. For illustration purpose, the magnetic storage element, is disposed in a dielectric layer 123 which corresponds to the MTJ level in between metal levels M3 and M4. It is understood that the magnetic storage element may be disposed in between any suitable adjacent metal levels.

The magnetic storage element, in one embodiment, includes a MTJ bit element having a MTJ stack 164. The MTJ stack may be disposed between first and second electrodes. The first electrode 165, for example, may be a bottom electrode while the second electrode 166 may be a top electrode. The bottom electrode 165, for example, is connected to the metal line 135 through the via plug 137. For illustration purpose, the MTJ stack, for example, includes four layers. It is understood that the MTJ stack may include any suitable number of layers. For example, the MTJ stack generally includes a magnetically fixed (pinned) layer, one or more tunneling barrier layers and a magnetically free layer. The MTJ stack, for example, may include a bottom-pinned MTJ stack or a top-pinned MTJ stack. Top and bottom refer to position of layers relative to the substrate surface. The magnetic layers of the MTJ stack, for example, may have magnetic orientations in perpendicular/in-plane direction. The MTJ stack, as illustrated, is a simplified MTJ stack. An actual MTJ stack may include other suitable layers.

By way of example, the free layer and the fixed layer may be CoFeB or CoFe based composite material and the tunneling barrier layer may be MgO or $Al_2O_3$. As for the top and bottom electrodes, they may be Ti, TiN, TaN or Ta. Other suitable materials for the MTJ element may also be useful. The various layers of the MTJ stack and the top and bottom electrodes may be formed using suitable deposition techniques, including physical vapor deposition (PVD) and may be patterned using suitable mask and etch technique to achieve a desired configuration.

The top electrode and upper layers of the MTJ stack of the magnetic storage element, for example, include a length dimension which is smaller than a length dimension of the bottom electrode and lower layers of the MTJ stack. A protective liner 143 may optionally be provided to protect portions of the MTJ stack. The protective liner, for example, may include SiN or other suitable dielectric materials. A via contact 157, for example, may optionally be disposed over the top electrode in the second upper dielectric layer 123. Other suitable configurations of the MTJ stack may also be useful.

A dielectric layer 125 is disposed over the second upper dielectric layer 123, covering the magnetic storage element. The dielectric layer 125 and the second upper dielectric layer 123, in one embodiment, correspond to upper ILD level 4. The dielectric layer 125 includes TEOS and may be formed by CVD. Other suitable configurations, materials and forming techniques for the dielectric layer may also be useful.

The dielectric layer 125 for example, includes a metal line 155. The metal line 155, for example, is disposed in metal level M4 and is coupled to the via contact 157. A dielectric liner 145, for example, is disposed between the metal level M4 and the MTJ level. The dielectric liner 145 may include the same or suitable dielectric material as described for dielectric liner 141. The metal line 155, for example, may serve as a bitline (BL). Providing the bitline at other metal levels may also be useful. Although one metal line 155 is shown, it is understood that there could be other suitable number of metal lines in the same metal level.

The via contact 157, for example, may be referred to as the top via contact and the metal line 155, for example, may be referred to as the top metal line. The dimensions of this metal line 155 and its underlying via contact 157, for example, may be defined at twice the minimum line resolution of the lithography and etch capability for a technology process node, which may be referred to as 2× design rule. For example, the thickness of the top metal line 155, for example, may be at least 2 times greater than the thickness of the metal line 135 below. The top via contact and top metal line include a conductive material, such as Cu. Other suitable configurations and conductive materials for the via contact and metal line may also be useful.

A pad level is disposed over the uppermost ILD level and may be referred to as a first surface (or front side) 111 of the MRAM chip or die 210a. The pad level, for example, is disposed over Mx. In the case where the device includes 4 metal levels as illustrated in FIG. 2a, the pad level is disposed over M4. The pad level includes a pad dielectric stack. The pad dielectric stack, for example, includes a first pad dielectric layer 147 disposed over the dielectric layer 125 and a second pad dielectric layer 127 disposed over the first pad dielectric layer. For example, the first pad dielectric layer includes silicon nitride while the second pad dielectric layer includes TEOS. The first and second pad dielectric layers may be formed by CVD. Other suitable dielectric materials and forming techniques may also be useful. As shown, a pad interconnect having a pad via contact and a die bond pad 132 is disposed in the pad level. The pad via contact is disposed in a pad opening that extends from the top surface of the second pad dielectric layer to the bottom surface of the first pad dielectric layer while the die bond pad 132 is disposed over the top surface of the second pad dielectric layer. The pad interconnect is coupled to the metal line 155 in the uppermost ILD level (e.g., M4). The pad interconnect, for example, includes an aluminum pad interconnect and may be formed by sputtering. Other suitable conductive materials and forming techniques may also be useful.

A passivation layer may be disposed over the pad dielectric layer. The passivation layer may also line the sidewalls of the chip or die 210a and over a top surface of a step portion 108 of the substrate which is part of the scribe/saw lane region 103 of the wafer substrate as shown in FIG. 1. The passivation layer, in one embodiment, includes a passivation stack having first and second passivation layers. For example, the first passivation layer 129 is disposed over the pad dielectric layers and includes a passivation oxide layer while the second passivation layer 149 is disposed over the first passivation layer and includes a passivation nitride layer. Other suitable passivation materials may also be useful.

In one embodiment, a magnetic shield layer 169 is disposed over the passivation layers on the first surface (or front side) 111 and the sidewalls of the MRAM chip or die 210a. The passivation layers and magnetic shield layer may serve as protective layers. The magnetic shield layer includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mμ metal) layer. The MRAM chip or die, as shown, is provided with front side and sidewall magnetic shields. As shown, the magnetic shield layer protects the MTJ bit element from external magnetic field on the first surface (front side) and sidewalls of the MRAM chip or die.

One or more die bond pad openings 113 are defined through a portion of the front side magnetic shield layer and the passivation layers and exposes a portion of the underlying die bond pad 132. In one embodiment, the opening 113 which exposes the die bond pad provides wire bonding to external devices. For example, the die bond pad opening is configured for receiving a wire bond (not shown) which is attached to the exposed die bond pad and allows the chip or die to be electrically coupled to an external device.

Figure 2B:
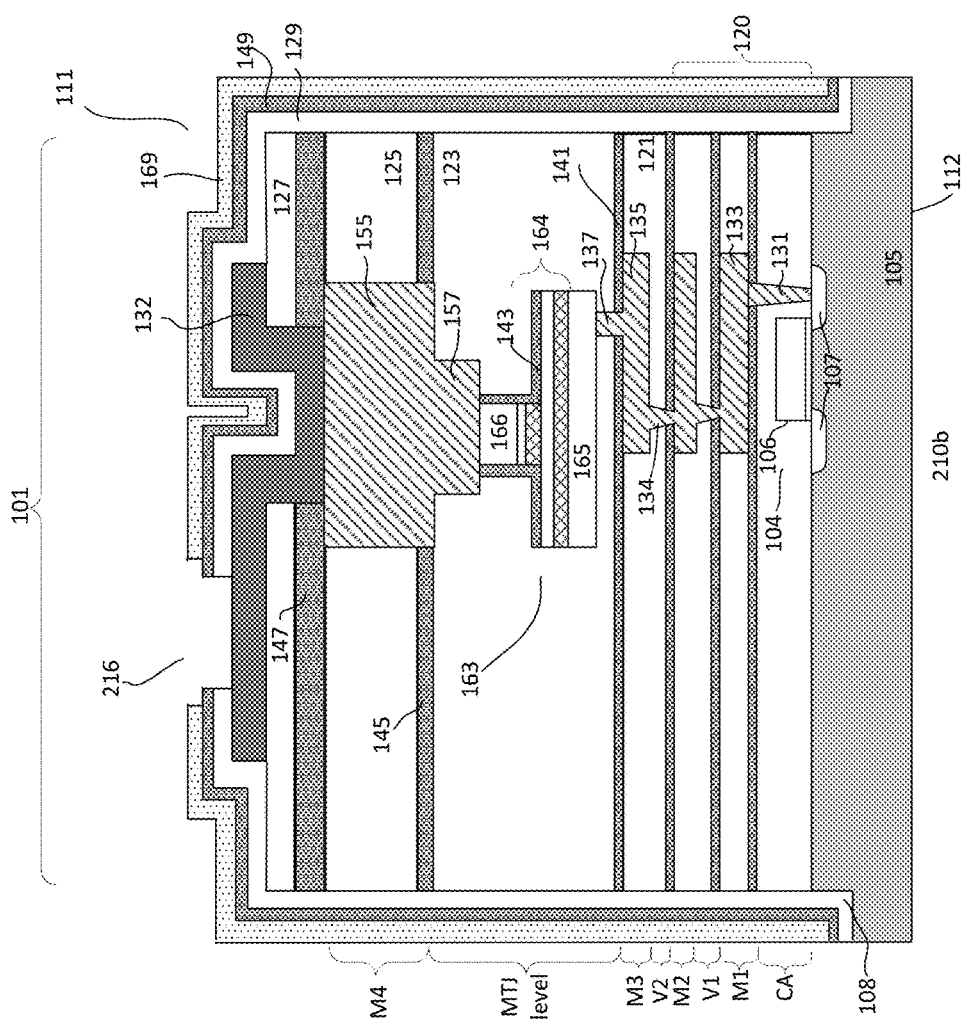

FIG. 2b shows a cross-sectional view of another embodiment of a singulated or individual MRAM chip or die 210b. The MRAM chip or die 210b as shown in FIG. 2b is similar to the MRAM chip 210a as shown in FIG. 2a. For example, similar to the MRAM chip 210a in FIG. 2a, the MRAM chip 210b also includes a front side magnetic shield layer 169 and passivation layers disposed on the first surface (or front side) and sidewalls of the MRAM die or chip. Common elements or features having the same reference numerals may not be described or described in detail. In the interest of brevity, the description of the MRAM chip 210b below primarily focuses on the difference(s) compared with the MRAM chip 210a shown in FIG. 2a.

Referring to FIG. 2b, the MRAM chip or die 210b includes one or more die bump pad openings 216. In one embodiment, the die bump pad opening 216 is configured for a flip chip. Additional front side magnetic shield layer 169 is removed from the die bump pad opening to expose a portion of the underlying passivation nitride layer 149. For example, the die bump pad opening 216 is configured for receiving a die microbump (not shown) which is attached to the exposed die bump pad 132 and allows the chip or die to be electrically coupled to an external device. The die microbump, for example, may include contact bump. The die microbump may be in the form of, for example, spherical shaped structure, ball or bump. The die microbump may be formed of solder or other types of conductive materials. Similar to the MRAM chip 210a, the MRAM chip 210b having the MTJ bit element is protected from magnetic field interferences by the magnetic shield layer disposed on the first surface (or front side) and sidewalls of the die or chip.

Figure 3:
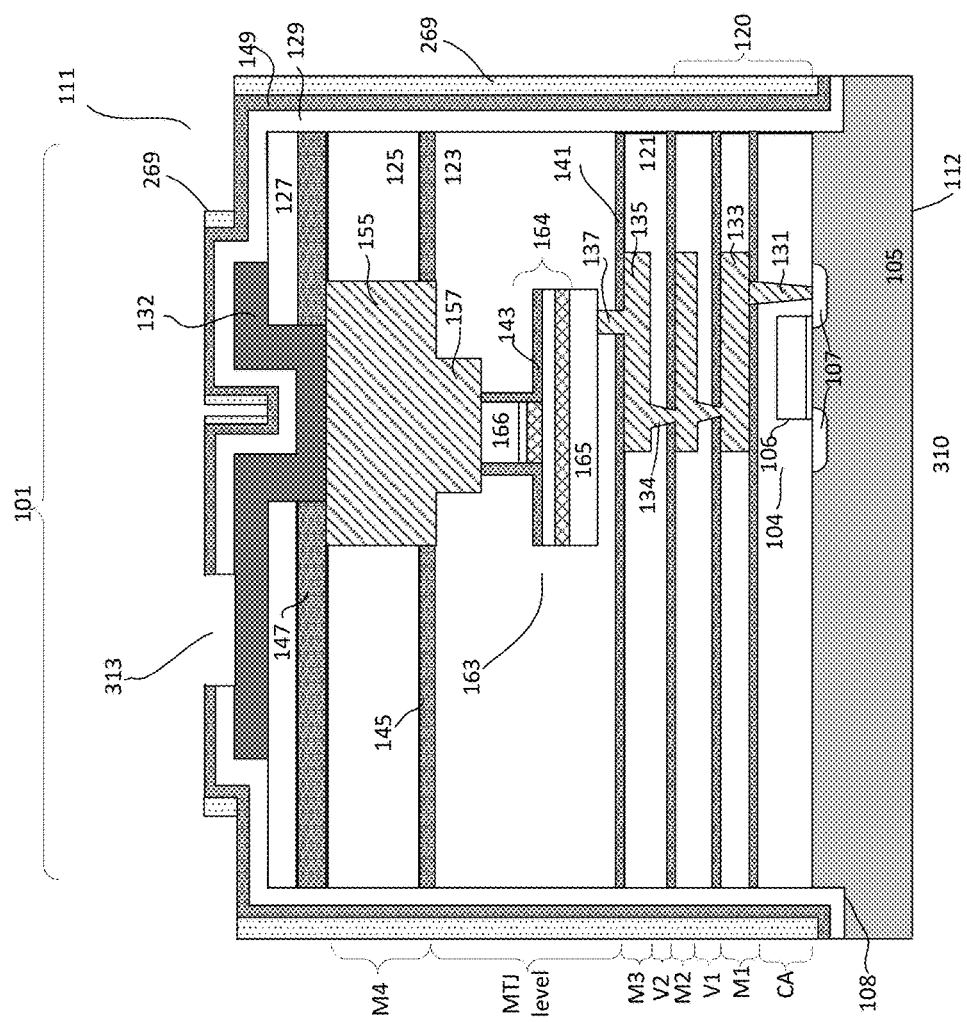
FIG. 3 shows an exemplary cross-sectional view of embodiment of MRAM chip with magnetic shield spacers.

FIG. 3 shows a cross-sectional view of another embodiment of a singulated or individual MRAM chip or die 310. The MRAM chip or die 310 as shown in FIG. 3 is similar to the MRAM chip 210a or 210b shown in FIG. 2a or FIG. 2b. For example, similar to the MRAM chip 210a or 210b, the MRAM chip 310 also includes passivation layers on the first surface (or front side) and sidewalls of the die or chip. Common elements or features having the same reference numerals may not be described or described in detail. In the interest of brevity, the description of the MRAM chip 310 below primarily focuses on the difference(s) compared with the MRAM chip 210a or 210b.

As shown in FIG. 3, magnetic shield layers in the form of magnetic shield spacers 269 are disposed over a portion of the second passivation layer 149. For example, the magnetic shield spacers line vertical portions of the second passivation layer while horizontal portions of the second passivation layer are devoid of the magnetic shield spacers. The magnetic shield spacers 269 disposed on the sidewalls of the die or chip partially protect the MTJ bit element against external perpendicular magnetic field. One or more die bond pad openings 313 expose a portion of the die bond pad 132 to provide for external connection. For example, the die bond pad opening 313 may be configured to receive a wire bond such that the die or chip may be bonded to an external device by wire bonding. Alternatively, the opening 313 may be a die bump pad opening configured to accommodate a die microbump including contact bump such that the die may be electrically connected to an external device, such as a package substrate, by a flip chip technique. Thus, the opening 313 may be referred to as die bond/bump pad opening.

The MRAM chips or dies 210a-210b and 310 as described have various advantages. The magnetic shield layer disposed on the front side and/or sidewalls of the die or chip provides sufficient magnetic shielding to protect the MTJ bit element from external magnetic interference. In addition, the magnetic shield layer is disposed on the sidewalls and cover a step portion of the substrate which is part of the scribe/saw lane region of the wafer substrate. Thus, the embodiments as described utilizes the scribe/saw lane region to provide for sidewall magnetic shielding which do not consume the space in the prime die region of the die. This allows more devices or components to be formed in the prime die region of the die.

Figure 4A:
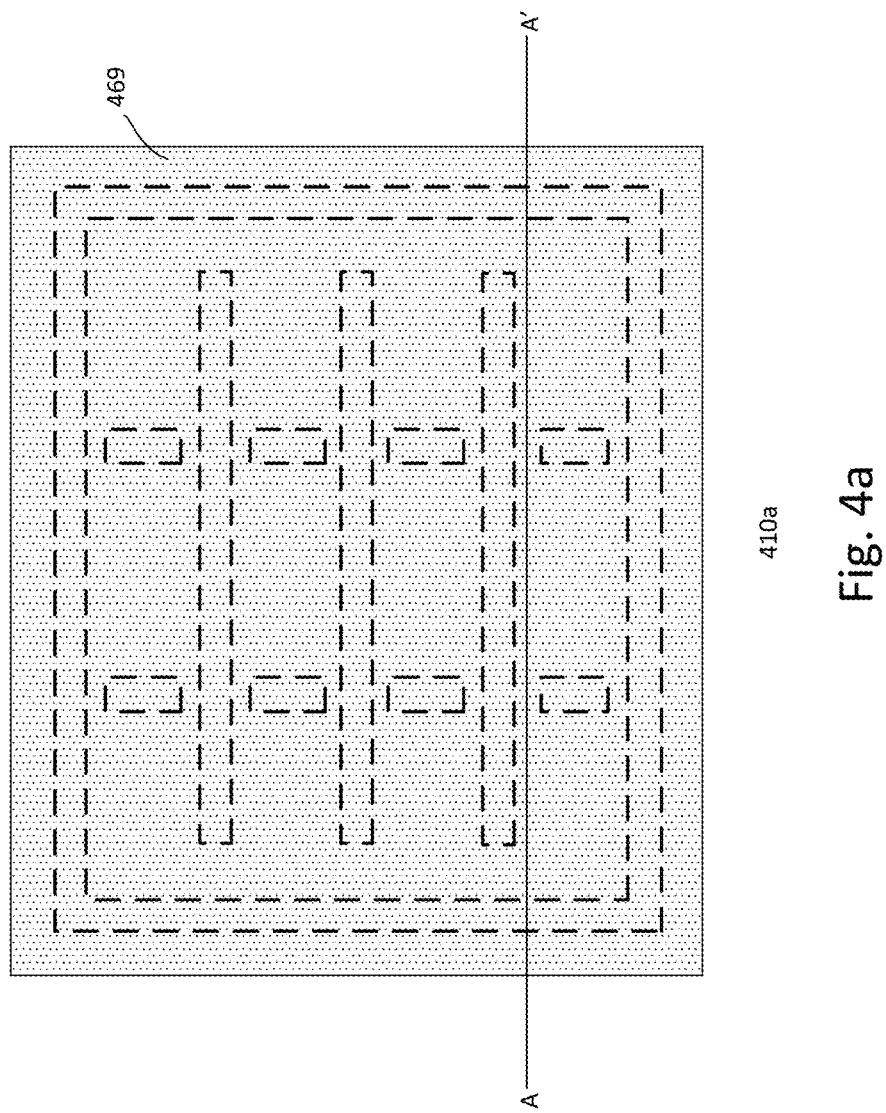
FIG. 4a shows a simplified top view and FIGS. 4b-4c show exemplary cross-sectional views of embodiments of MRAM chip with front side and thick lateral magnetic shields.
Figure 4B:
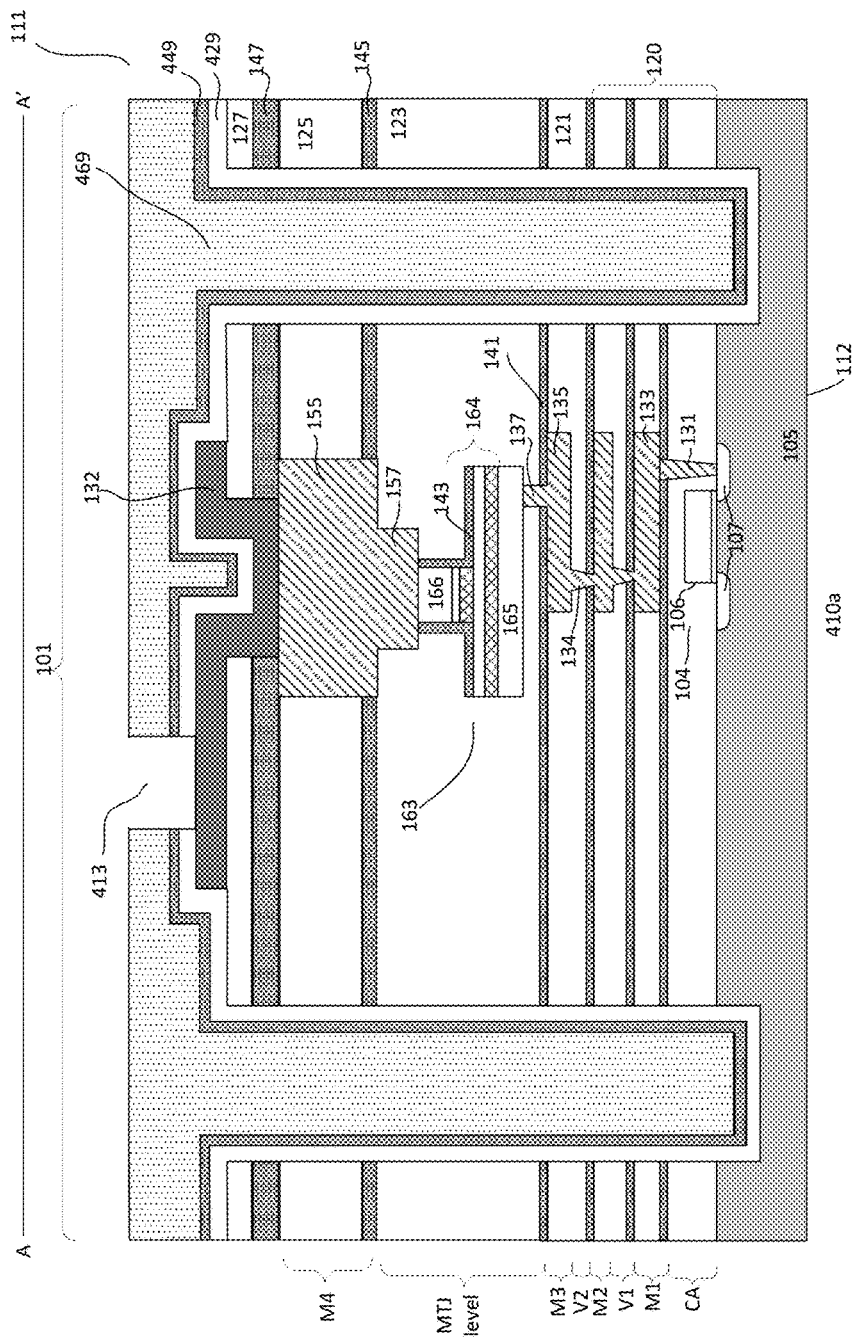

FIG. 4a shows a simplified top view and FIG. 4b shows a cross-sectional view of another embodiment of a singulated or individual MRAM chip or die 410a taken along A-A'. The MRAM chip or die 410a as shown in FIGS. 4a-4b is similar to the MRAM chip 210a shown in FIG. 2a. For example, similar to the MRAM chip 210a, the MRAM chip 410a also includes a magnetic storage element 163 having MTJ stack disposed in the MRAM region. Common elements or features having the same reference numerals may not be described or described in detail. In the interest of brevity, the description of the MRAM chip 410a below primarily focuses on the difference(s) compared with the MRAM chip 210a.

Referring to FIG. 4a, the MRAM chip or device 410a includes deep trenches (dotted lines shown in top view of FIG. 4a) within the prime die region 110. The deep trenches, for example, are disposed adjacent to various sides of the magnetic storage element 163 within the prime die region 110. Referring to FIG. 4b, the deep trenches extend from a top surface of the second pad dielectric layer 127 and partially into a portion of the substrate 105. The deep trenches extend to within the substrate and the bottom of the deep trenches terminate at a distance away from the bottom surface of the substrate. The deep trenches, for example, includes a width of about 150 µm and a depth of about 100-200 µm. Other suitable width and depth dimensions may also be useful.

In one embodiment, the MRAM chip 410a includes a passivation layer disposed over the top surface of the second pad dielectric layer and lines the sidewalls and bottom of the deep trenches. The passivation layer, for example, includes first and second passivation layers 429 and 449. The first passivation layer 429 is disposed on top of the second pad dielectric layer and lines the sidewalls and bottom of the deep trenches while the second passivation layer 449 is disposed over the first passivation layer. The first passivation layer 429, for example, includes a passivation oxide layer while the second passivation layer 449 includes a passivation nitride layer. Other suitable passivation materials may also be useful.

In one embodiment, a magnetic shield layer 469 is disposed on top of the passivation layer and fills the remaining of the deep trenches as shown in FIG. 4b. As shown, the magnetic shield layer covers a first surface (or front side) of the chip or die and fills the deep trenches, surrounding the array of magnetic storage element. For simplicity, only one MTJ bit from an array of bits is shown. The magnetic shield layer 469, includes the same or suitable magnetic shield material as described for the magnetic shield layer 269. The magnetic shield layer 469, for example, is about 150 µm thick and provides front side and lateral magnetic shielding to protect the magnetic storage element from external magnetic field interferences.

Referring to FIG. 4b, one or more die bond pad openings 413 are defined through a portion of the magnetic shield layer and the passivation layers and expose a portion of the underlying die bond pad 132. The die bond pad opening 413 is similar to the die bond pad opening 113 as described in FIG. 2a. For example, the die bond pad opening 413 is configured for receiving a wire bond (not shown) which is attached to the exposed die bond pad and allows the die or chip to be electrically coupled to an external device. The MRAM chip or die, as shown, is provided with front side and thick lateral magnetic shields.

Figure 4C:
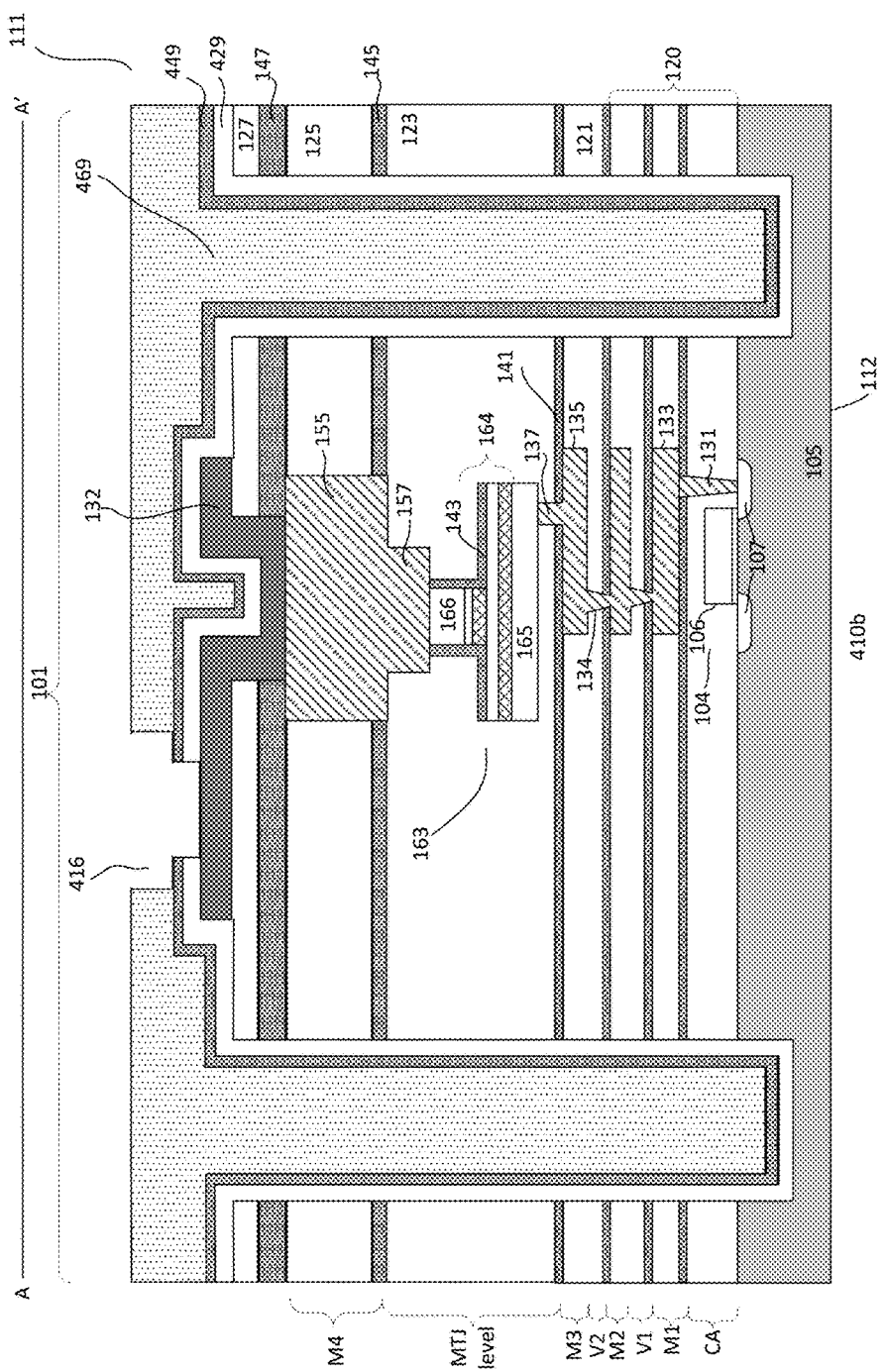

FIG. 4c shows a cross-sectional view of another embodiment of a singulated or individual MRAM chip or die 410b. The MRAM chip or die 410b as shown in FIG. 4c is similar to the MRAM chip 410a shown in FIGS. 4a-4b. For example, the MRAM chip or device 410b also includes deep trenches (dotted lines shown in top view of FIG. 4a) within the prime die region 110. Thus, common elements or features having the same reference numerals may not be described or described in detail. In the interest of brevity, the description of the MRAM chip 410b below primarily focuses on the difference(s) compared with the MRAM chip 410a.

As shown in FIG. 4c, additional front side magnetic shield layer may be removed to define one or more die bump pad openings 416 to expose a portion of the underlying passivation nitride layer 449. The die bump pad opening 416 is similar to the die bump pad opening 216 as described in FIG. 2b. For example, the die bump pad opening 416 is configured for receiving a die microbump, such as contact bump or ball bump, which is attached to the exposed die bump pad 132 and allows the die or chip to be electrically coupled to an external device.

Figure 5:
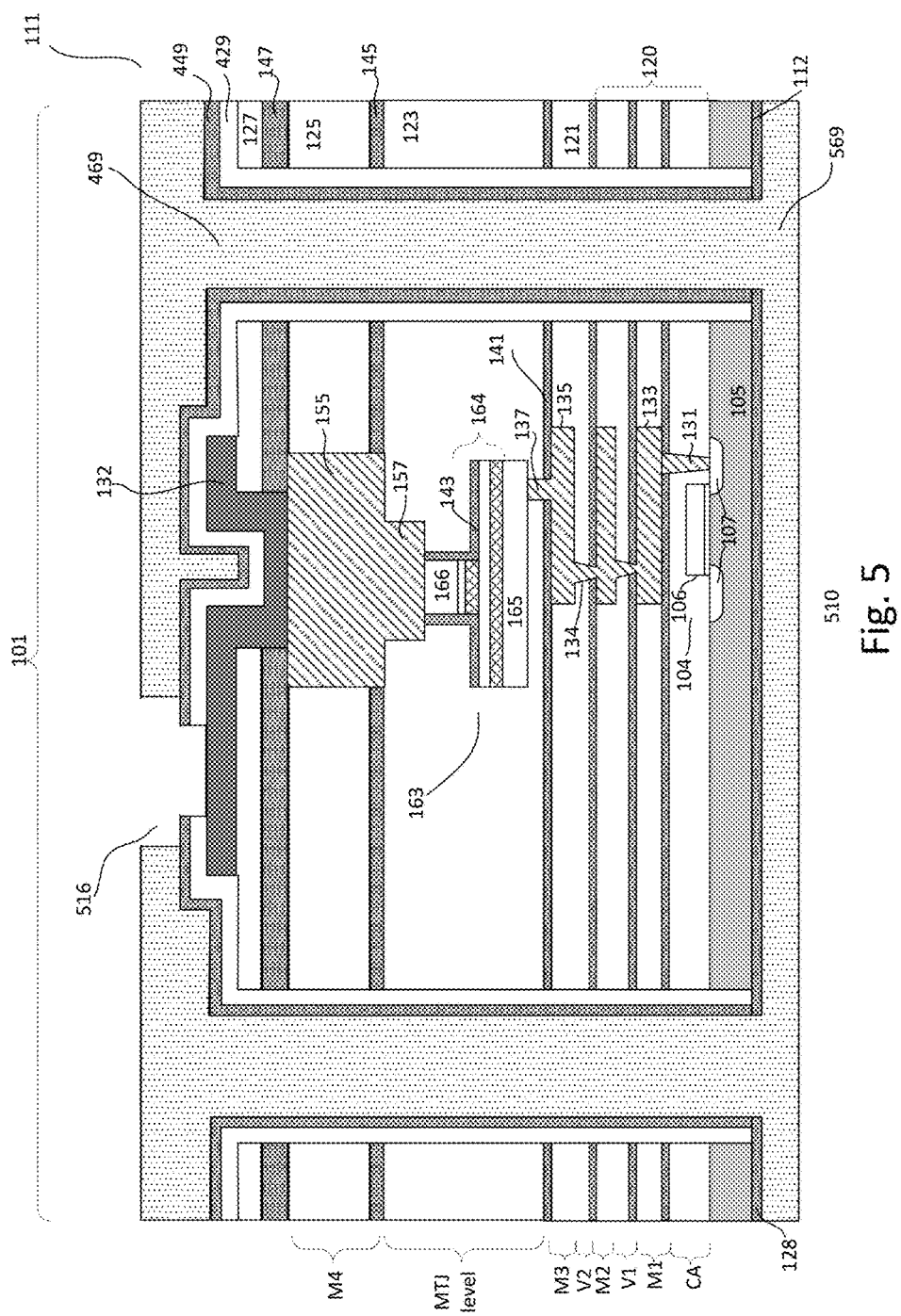
FIG. 5 shows an exemplary cross-sectional view of an embodiment of MRAM chip with front side, thick lateral and back side magnetic shields.

FIG. 5 shows a cross-sectional view of another embodiment of a singulated or individual MRAM chip or die 510. The MRAM chip or die 510 as shown in FIG. 5 is similar to the MRAM chip 410a or 410b shown in FIG. 4b or FIG. 4c. For example, similar to the MRAM chip 410a or 410b, the MRAM chip 510 also includes deep trenches within the prime die region surrounding an array of MTJ bits. For simplicity, only one MTJ bit from an array of bits is shown. The deep trenches are lined with passivation layers 429 and 449 and are filled with a magnetic shield layer 469. Common elements or features having the same reference numerals may not be described or described in detail. In the interest of brevity, the description of the MRAM chip 510 below primarily focuses on the difference(s) compared with the MRAM chip 410a or 410b.

In one embodiment, the MRAM chip or die 510 differs from the MRAM chip or die 410a or 410b in that the deep trenches extend from the top surface of the second pad dielectric layer 127 to the bottom surface (or back side) 112 of the thinned substrate. In one embodiment, the first passivation layer 429 lines the top surface of the second pad dielectric layer and sidewalls of the deep trenches while the second passivation layer 449 is disposed over the first passivation layer. In one embodiment, a front side magnetic shield layer 469 is disposed over the second passivation layer and fills the deep trenches while a dielectric layer 128 and a back side magnetic shield layer 569 are disposed on the bottom surface (or back side) of the thinned substrate. The dielectric layer 128 includes an adhesive or silicon nitride. Other suitable dielectric material which provides adhesion and isolates the back side magnetic shield layer 569 from the thinned substrate may also be useful. The front side magnetic shield layer 469 which is a continuous layer that extends from the top surface (or front side of the die or chip) to the bottom surface (or back side of the die or chip) through the deep trenches together with the back side magnetic shield layer 569 surround the array of magnetic storage elements (MTJs). The front side and back side magnetic shield layers 469 and 569 provide front side and back side as well as lateral magnetic shielding to protect the array of magnetic storage elements (MTJs) from external magnetic field. For simplicity, only one MTJ bit of an array of bits is shown. Thus, the array of MTJ bits is protected from magnetic field interferences on multiple sides of the chip or die.

As shown, one or more die bump pad openings 516 are defined to expose a portion of the underlying passivation nitride layer 449. The die bump pad opening 516 is similar to the die bump pad opening 216 or 416. For example, the die bump pad opening 516 is configured for receiving a die microbump, such as contact bump or ball bump, which is attached to the exposed die bump pad and allows the die to be electrically coupled to an external device.

The MRAM chips or dies 410a-410b and 510 as described have various advantages. The front side, lateral and back side magnetic shields provide sufficient magnetic shielding on multiple sides of the MRAM chip to protect the array of MTJ elements from external magnetic interference. In addition, the magnetic shield layer disposed within the prime die region in the deep trenches are relatively thick and provides effective lateral side magnetic shielding to the array of MTJ elements.

Figure 6:
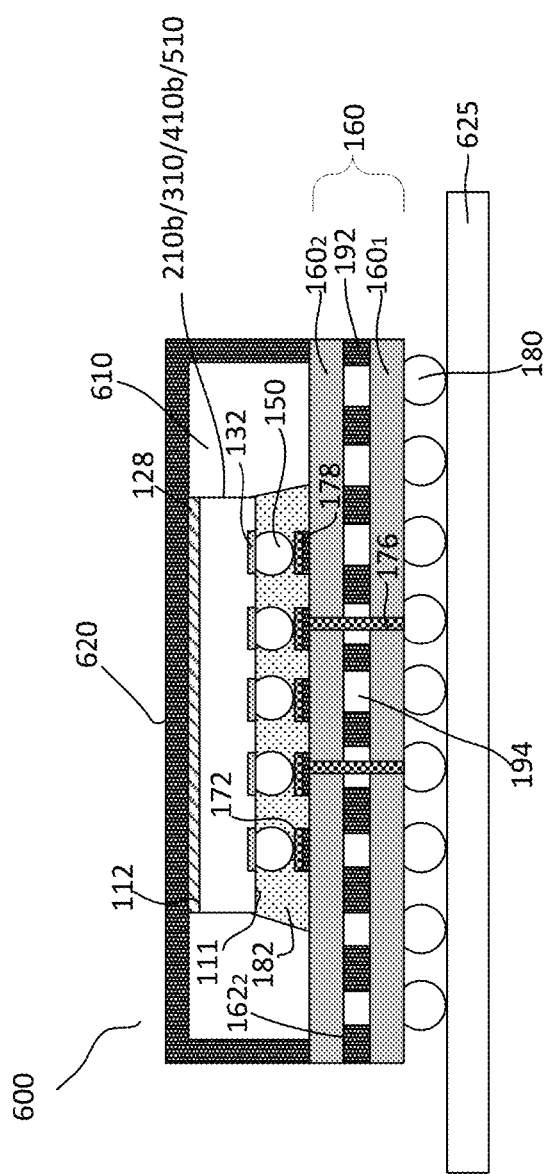
FIG. 6 shows an exemplary cross-sectional view of an embodiment of MRAM chip with magnetic shielding in the chip-level and package level.

The embodiments as described in FIGS. 2a-2b, 3, 4a-4c and 5 provide for chip level magnetic shielding processed at the wafer-level. The MRAM chips or dies as described may be electrically connected to an external device, such as a package substrate, to form a semiconductor package. FIG. 6 shows an exemplary embodiment of a MRAM assembly or package 600. In one embodiment, a die or chip is mounted to a die attach region defined on the first surface (top surface) of the package substrate 160. For illustration purpose, the die includes a flip chip die. Thus, the die disposed on the package substrate 160 may include any of the singulated die 210b, 310, 410b and 510 as described in FIG. 2b, 3, 4b or 5. It is understood that the MRAM package 600 may be modified to include a wire bonded die. In such case, the die disposed on the package substrate 160 may include any of the singulated die 210a and 410a as described in FIG. 2a or FIG. 4b. The MRAM package 600 may be coupled to an external substrate, such as a printed circuit board (PCB) 625.

The MRAM assembly or package 600 may further include one or more magnetic shield materials disposed on different locations of the assembly to provide for package level magnetic shielding. As an example, magnetic permeable underfill dielectric material 182 may be provided in the space between the die and the top surface of the package substrate 160. In addition, magnetic shield traces 178 may be disposed below the package contact traces 172 over the top surface of the package substrate. Moreover, the package substrate 160 may include first and second package substrate layers $160_1$ and $160_2$ having a magnetic shield layer 192 with dielectric vias 194 sandwiched therebetween and through-hole contacts 176 coupling the die microbumps 150 to the package balls 180. A description of magnetic shield materials or layers provided on the package level is provided in, for example, co-pending U.S. patent application Ser. No. 15/080,541, filed on Mar. 24, 2016, entitled "Magnetic Shielding of MRAM Package", which is herein incorporated by reference for all purposes. Further, the MRAM package 600 may include a magnetic shield cap 620 which encapsulates the die or chip and top surface of the package substrate and attached to the die through an adhesive 128. The MRAM package may also include a magnetic permeable interface dielectric material 610 that fills the space between the die and the cap as shown in FIG. 6. The magnetic shield cap 620, for example, may include the same material as the magnetic shield layer 269 while the magnetic permeable interface dielectric material 610 may include the same material as the magnetic permeable underfill dielectric material 182.

FIGS. 7a-7e illustrate an embodiment of a process 700 for forming a MRAM chip or die. The MRAM chip or die formed by process 700 is similar to the MRAM chip or die 210a or 210b as described in FIG. 2a or 2b. Common elements, indicated by the same reference numerals, may not be described or described in detail. For simplicity, the processes of forming transistors on the substrate 105 using FEOL processing and forming the ILD levels with various via contacts and metal lines as well as forming the magnetic storage element having MTJ stack in adjacent metal levels in the ILD layer using back end of line (BEOL) processing will not be described.

Figure 7A:
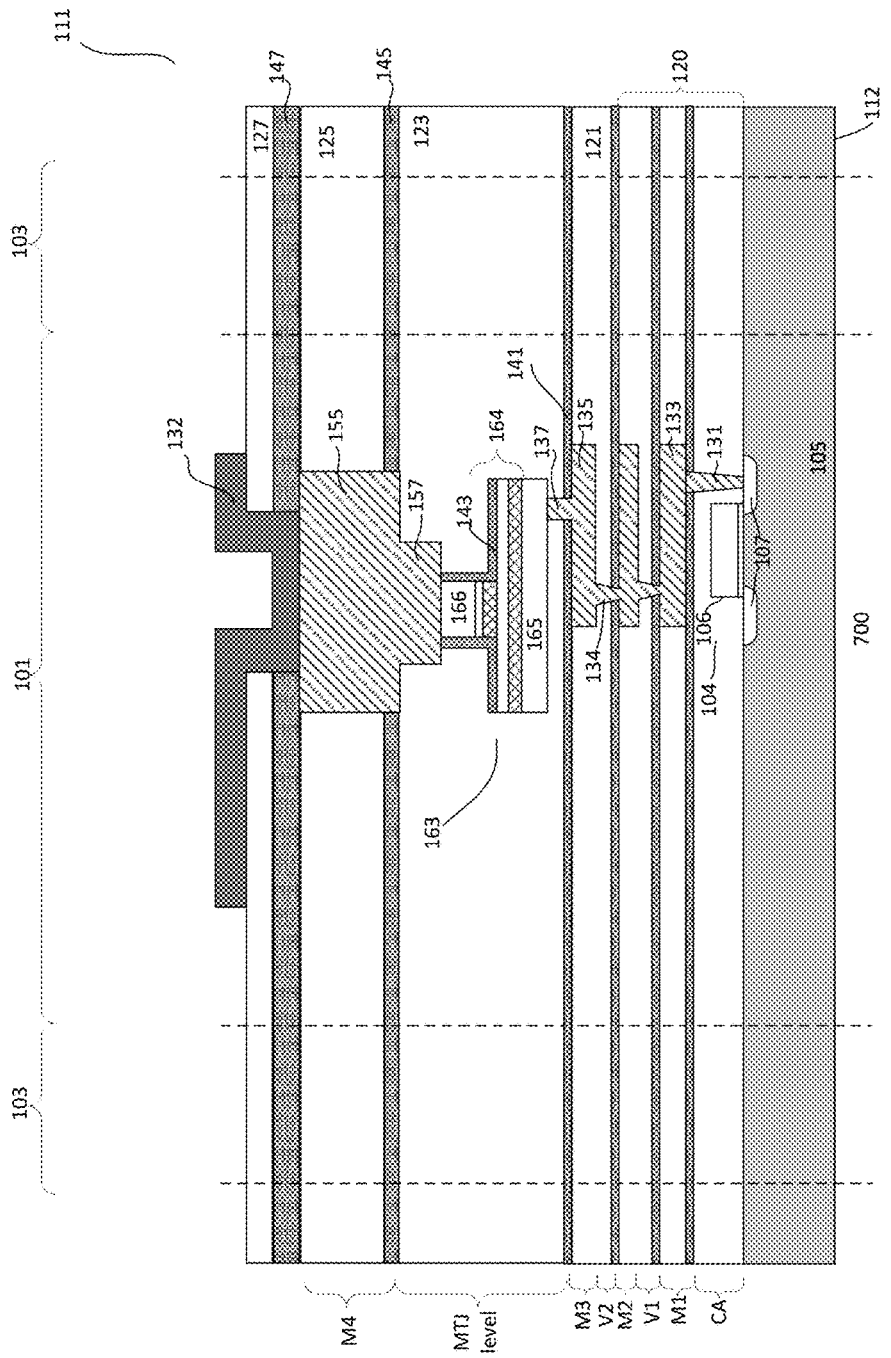
FIGS. 7a-7e show an exemplary embodiment of a process flow for forming front side magnetic shield and sidewall magnetic shield in the scribe/saw lane regions of a MRAM wafer.

Referring to FIG. 7a, a portion of a processed MRAM wafer is shown. As shown, the magnetic storage element is defined within the prime die region 110 and scribe/saw lane regions 103 surrounding the prime die region 101. The process 700 is at the stage of wafer level processing immediately after forming a pad level having a first pad dielectric layer 147 and a second pad dielectric layer 127 covering the metal line 155 in the uppermost upper ILD layer (e.g., M4). For example, the first pad dielectric layer includes silicon nitride having a thickness of about 3000 Å while the second pad dielectric layer includes TEOS having a thickness of about 4500 Å. Other suitable dielectric materials and thicknesses may also be useful.

Referring to FIG. 7a, the process 700 continues to form one or more die bond pads 132. As shown, a pad via opening is formed in the first and second pad dielectric layers. The pad opening, for example, extends from the top surface of the second pad dielectric layer to the bottom surface of the first pad dielectric layer and exposes a portion of the metal line 155. The pad via opening may be formed by mask and etch techniques. For example, a patterned photoresist mask (not shown) may be formed over the pad level, serving as an etch mask. An etch, such as RIE, may be used to pattern the pad dielectric layers with the patterned mask. The etch, for example, removes the exposed portions of the first and second pad dielectric layers to expose a portion of the metal line 155.

A conductive layer is formed on the substrate, covering the pad level and fills the pad via opening. The conductive layer, for example, is an aluminum layer. The aluminum layer, for example, is used to form an aluminum pad interconnect. The conductive layer may be formed by, for example, sputtering. Other suitable conductive materials and forming techniques may also be useful. The conductive layer is patterned using suitable mask and etch technique to define a pad interconnect having a pad via contact lining the pad via opening and a die bond pad 132 disposed over the top surface of the second pad dielectric layer 127.

Figure 7B:
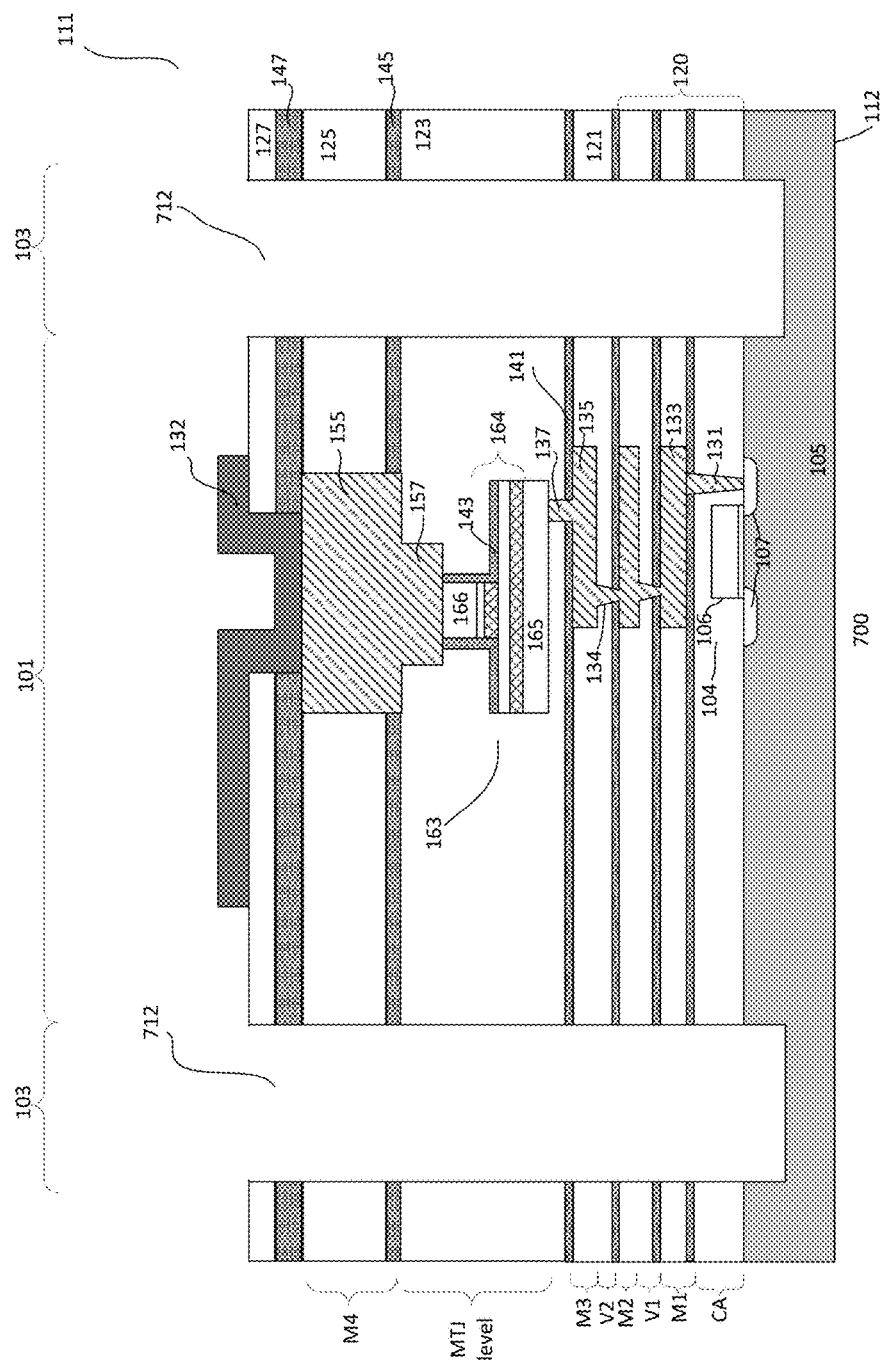

Referring to FIG. 7b, the process 700 continues by introducing openings through the wafer. In one embodiment, a first singulation process is performed through the scribe/saw lane regions or dicing channels of the wafer. In one embodiment, the first singulation process may be achieved by mechanical sawing, laser drilling, deep reactive ion etch (DRIE), or any suitable techniques. The first singulation, in one embodiment, includes a partial cut to the wafer substrate and may not fully separate the wafer into individual dies or chips at this stage. The partial cut, as shown, introduces openings or grooves/channels 712 which extend partially into the wafer. In one embodiment, the openings 712 extend from the top surface of the second pad dielectric layer 127 to within a portion of the substrate 105. The openings 712 extend to within the substrate and the bottom of the openings terminate at a distance away from the bottom surface (or back side) 112 of the substrate. The openings, for example, include a width of about 60-150 µm and a depth of about 100-200 µm. Other suitable width and depth dimensions may also be useful.

Figure 7C:
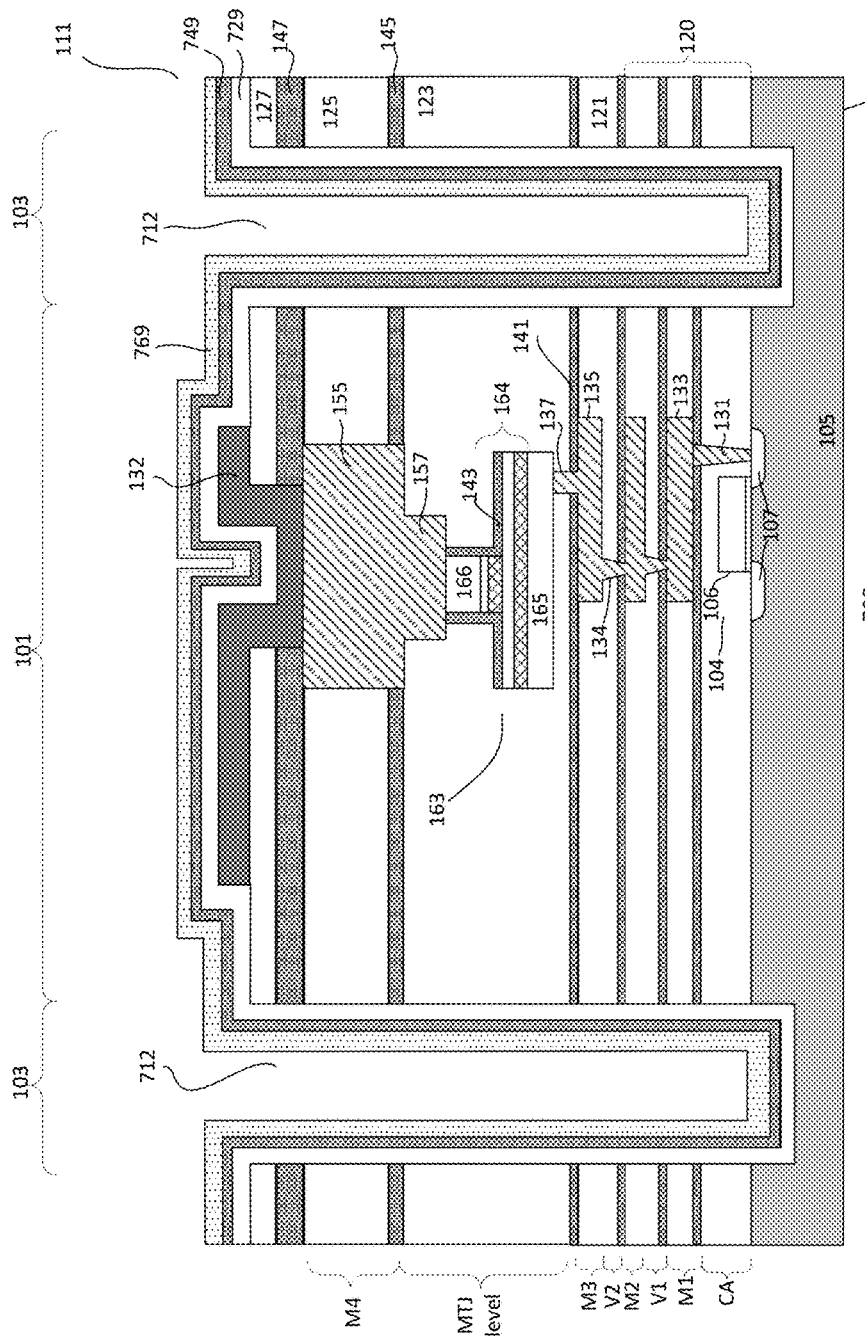
Figure 7D:
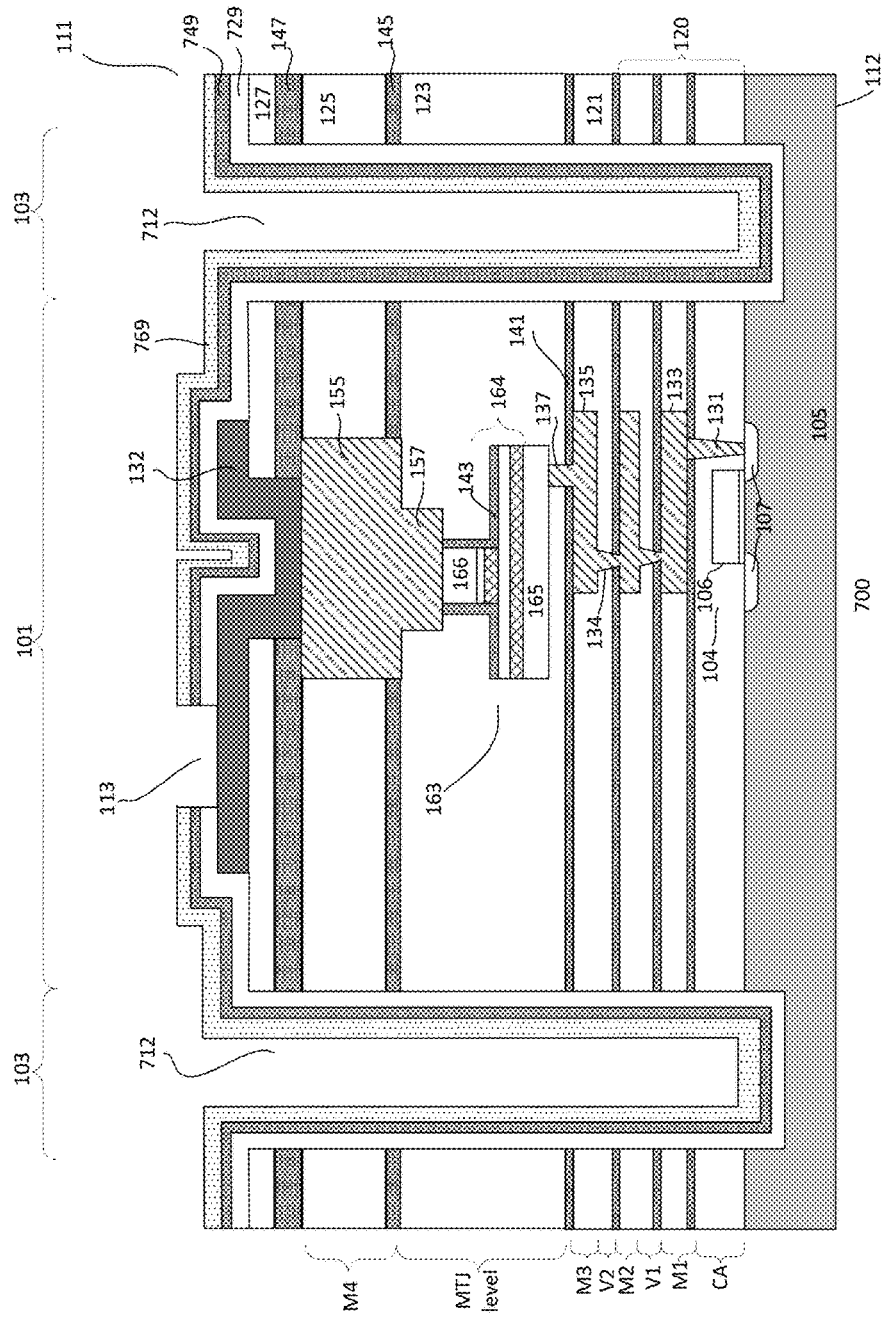

In FIG. 7c, the process 700 continues to form a passivation layer on the first surface (or front side) 111 of the wafer and sidewalls and bottom of the openings 712. In one embodiment, the process forms a first passivation layer 729 over the top surface of the second pad dielectric layer and lines the sidewalls and bottom of the openings while a second passivation layer 749 is formed over the first passivation layer. For example, the first passivation layer includes a passivation oxide layer having a thickness of about 5000 Å while the second passivation layer includes a passivation nitride layer having a thickness of about 4800 Å. The first and second passivation layers may be formed by CVD. Other suitable passivation materials, thicknesses and forming techniques may also be useful.

A magnetic shield layer 769 is conformally formed over the passivation layers on the first surface 111 and lining the sidewalls and bottom of the openings 712 in the scribe/saw lane region 103 as shown in FIG. 7c. The magnetic shield layer, for example, includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mn metal) layer. The magnetic shield layer may be formed by PVD or electrochemical deposition (plating) or a combination thereof having a thickness of about 5 nm-1 nm. Other suitable forming techniques and thicknesses may also be useful.

One or more die bond pad openings 113 are formed through the magnetic shield layer and the passivation layers, exposing a portion of the die bond pad 132 in the pad level. To form the die bond pad openings, the magnetic shield and passivation layers may be patterned using suitable mask and etch techniques. Exposed portions of the magnetic shield and passivation layers are removed by RIE. Other suitable techniques may also be useful. The die bond pad opening 113 exposes underlying die bond pad for wire bonding to connect to exterior devices. In other embodiments, the opening may also be enlarged which exposes portion of the passivation nitride and underlying die bump pad 132 to form a die bump pad opening 216 described in FIG. 2b, which is configured for accommodating die microbump for flip chip packaging.

Figure 7E:
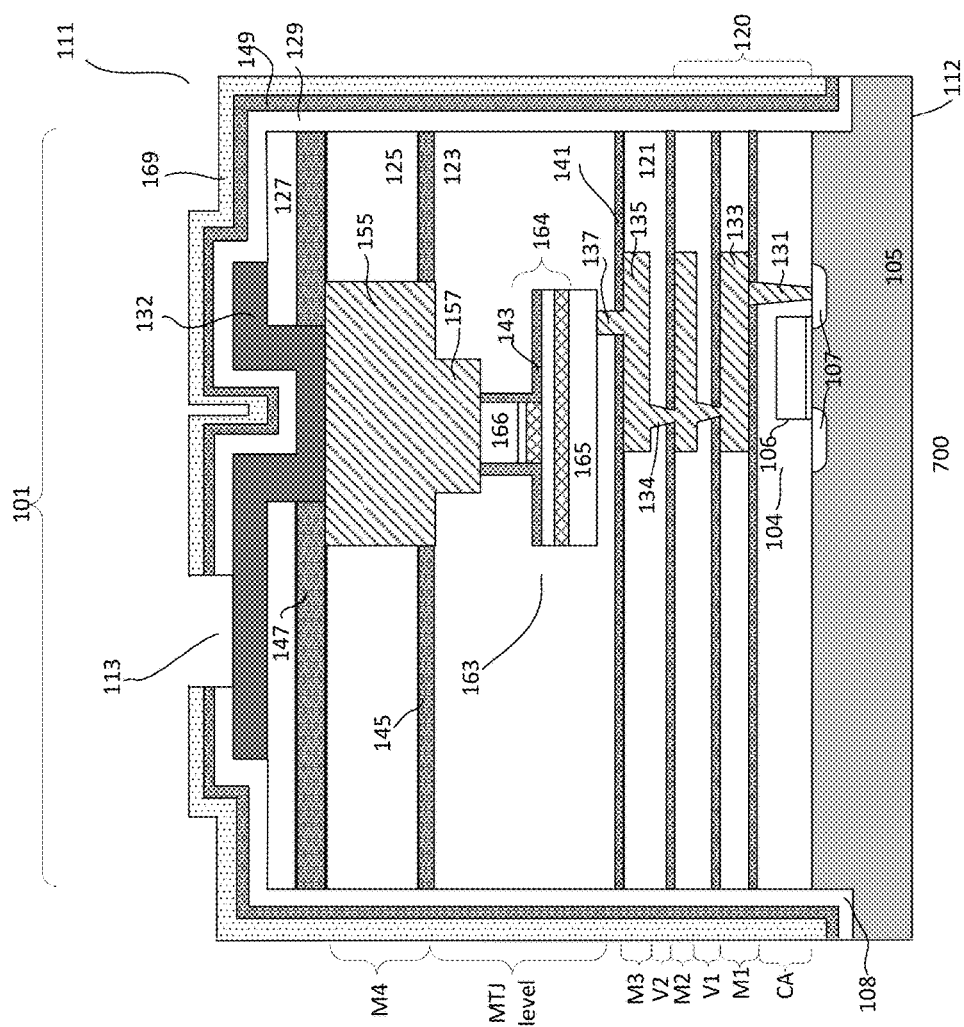

In one embodiment, the process continues with a second singulation process which is performed through the scribe/saw lane regions 103 as shown in FIG. 7e. In one embodiment, the second singulation process may be achieved by mechanical sawing, DRIE or other suitable techniques. In one embodiment, the second singulation process singulates or separates the dies or chips in a wafer format through the scribe/saw lane regions to form individual MRAM chips or dies, such as that described and shown in FIG. 2a or FIG. 2b. As shown, the magnetic shield and passivation layers lining the sidewalls of the die or chip are also disposed over a step portion of the substrate which is part of the scribe/saw lane region. Referring to FIG. 7e, the first surface (front side) 111 and the sidewalls of the MRAM die or chip defined by sidewalls of the openings in the scribe/saw lane regions are covered with passivation layers and magnetic shield layer. The sensitive MTJ array of the MRAM chip is protected on the first surface and sidewalls from magnetic field interferences. The magnetic shield layer covering the first surface (active surface) and the sidewalls of the die or chip protects the sensitive MTJ array from top in-plane and side perpendicular interferences of external magnetic fields. Thus, the MRAM chip is provided with front side and sidewall magnetic shields.

Figure 8A:
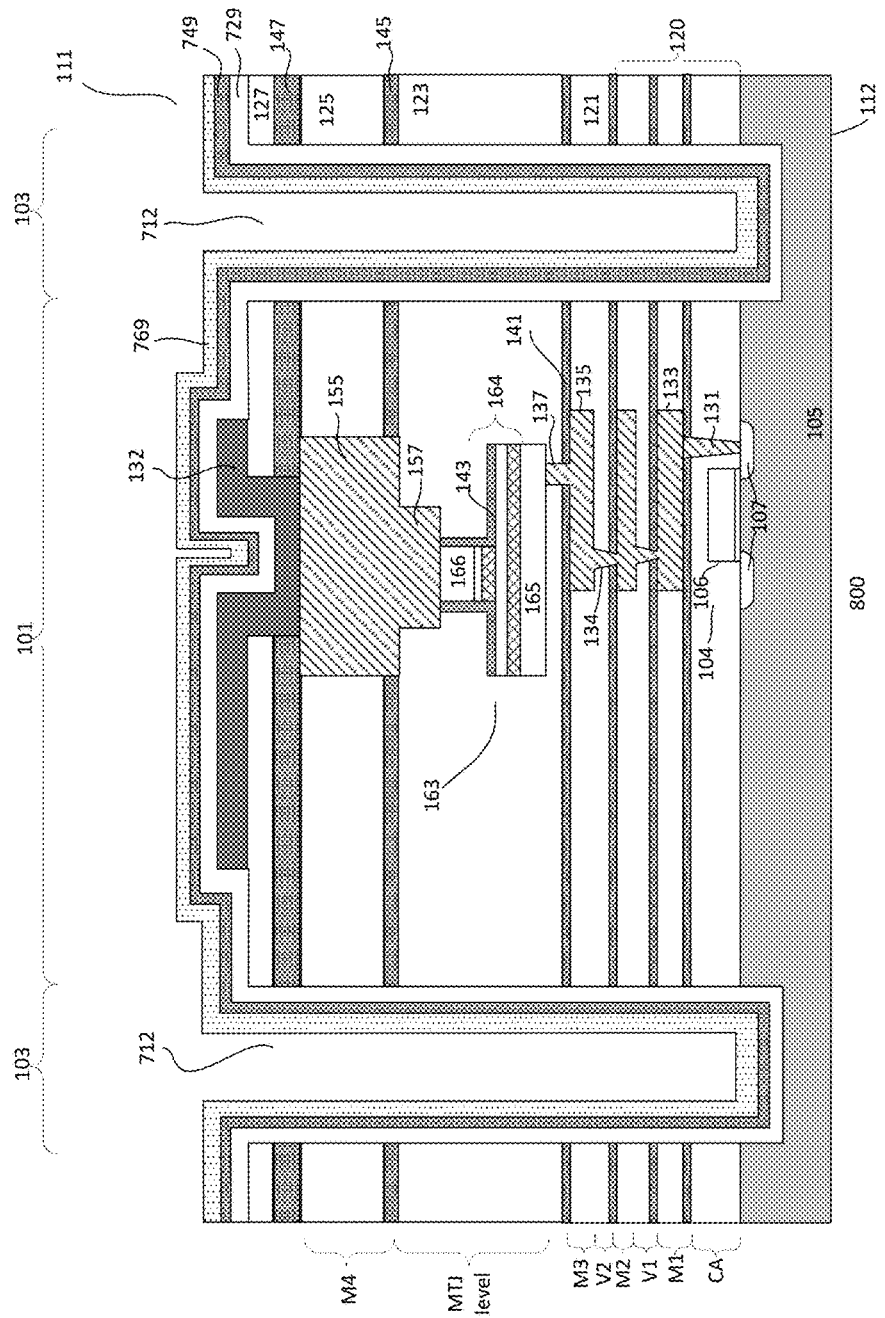
FIGS. 8a-8c show an exemplary embodiment of a process flow for forming sidewall magnetic shield in the scribe/saw lane regions of a MRAM wafer.
Figure 8B:
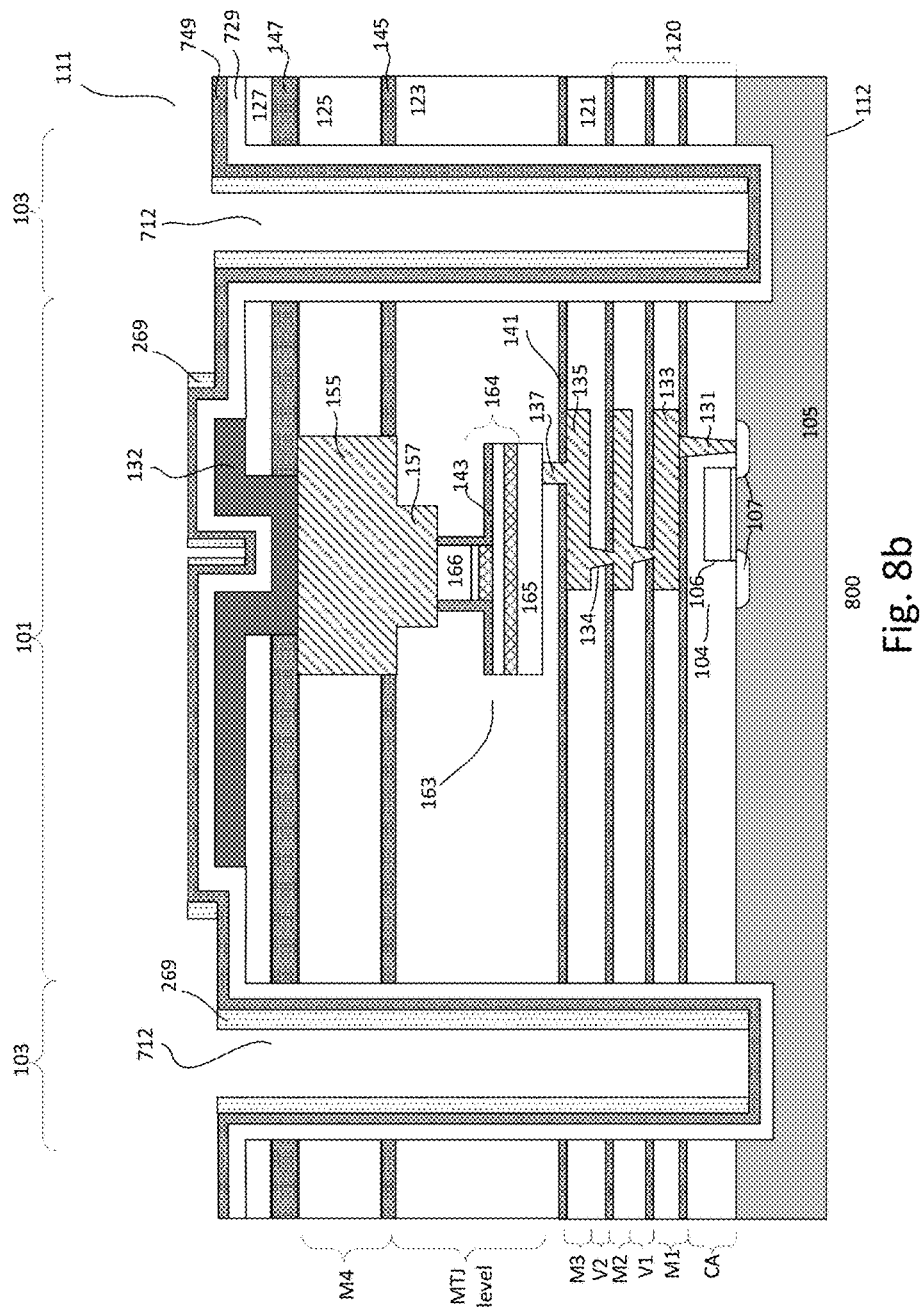
Figure 8C:
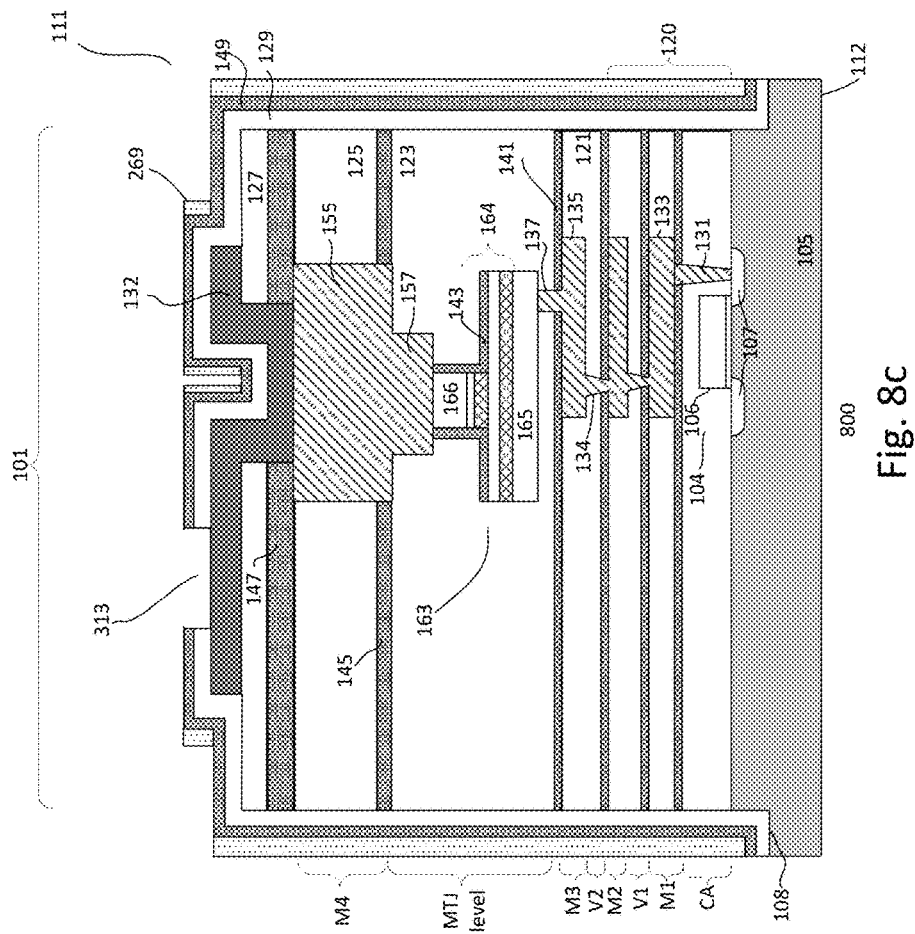

FIGS. 8a-8c show another embodiment of a process 800 for forming a MRAM chip or die. The process 800, for example, is similar to the process 700 as described in FIGS. 7a-7e and the MRAM chip or die formed by process 800 is similar to the MRAM chip or die 310 as described in FIG.

3. Common elements, indicated by the same reference numerals, may not be described or described in detail. In the interest of brevity, the description of the process 800 below primarily focuses on the difference(s) compared with the process 700 shown in FIGS. 7a-7e.

Referring to FIG. 8a, the process 800 is at the stage similar to that described in FIG. 7c. For example, a first passivation layer 729 is conformally formed over the top surface of the second pad dielectric layer and lines the sidewalls and bottom of the openings 712 in the scribe/saw lane regions 103 while a second passivation layer 749 is conformally formed over the first passivation layer. A magnetic shield layer 769 is conformally formed over the passivation layers on the first surface 111 and lining the sidewalls and bottom of the openings 712 in the scribe/saw lane region 103.

The process 800 continues to process the magnetic shield layer 769. Referring to FIG. 8b, the process 800 continues by performing a blanket etch process, such as RIE, to remove horizontal portions of the magnetic shield layer, leaving vertical portions of the magnetic shield layer as magnetic shield spacers 269 lining sidewalls of the openings 712 and vertical portions of the second passivation layer 749. Other suitable techniques may also be used to remove horizontal portions of the magnetic shield layer. As shown, the magnetic shield spacers 269 lining sidewalls of the openings in the scribe/saw lane regions protect the sensitive MTJ array from the external magnetic field interferences without occupying spaces in the prime die regions.

One or more die bond/bump pad openings 313 are formed through the passivation layers, exposing a portion of die bond/bump pad 132 in the pad level as shown in FIG. 8c. The one or more die bond/bump pad openings are formed using technique as described in FIG. 7d. The die bond/bump pad opening 313 exposes underlying die bond/bump pad for wire bonding or flip chip assembly to connect to exterior devices.

The process continues 800 with a second singulation process which is performed through the scribe/saw lane regions 103 as shown in FIG. 8c. The second singulation process may be performed using suitable techniques as described in FIG. 7e. The second singulation process, for example, singulates or separates the dies or chips in a wafer format through the scribe/saw lane regions to form individual MRAM chips or dies, such as that described and shown in FIG. 3. The sidewalls of the singulated MRAM die or chip which are defined by sidewalls of the scribe/saw lane regions are covered with magnetic shield layers or spacers. The MTJ array of the MRAM chip is protected by the magnetic shield spacers on the sidewalls from magnetic field interferences.

FIGS. 9a-9f show another embodiment of a process 900 for forming a MRAM chip or die. The process 900, for example, is similar to the process 700 as described in FIGS. 7a-7e and the MRAM chip or die formed by process 900 is similar to the MRAM chip or die 410a or 410b as described in FIG. 4b or 4c. Common elements, indicated by the same reference numerals, may not be described or described in detail. In the interest of brevity, the description of the process 900 below primarily focuses on the difference(s) compared with the process 700 shown in FIGS. 7a-7e.

Figure 9A:
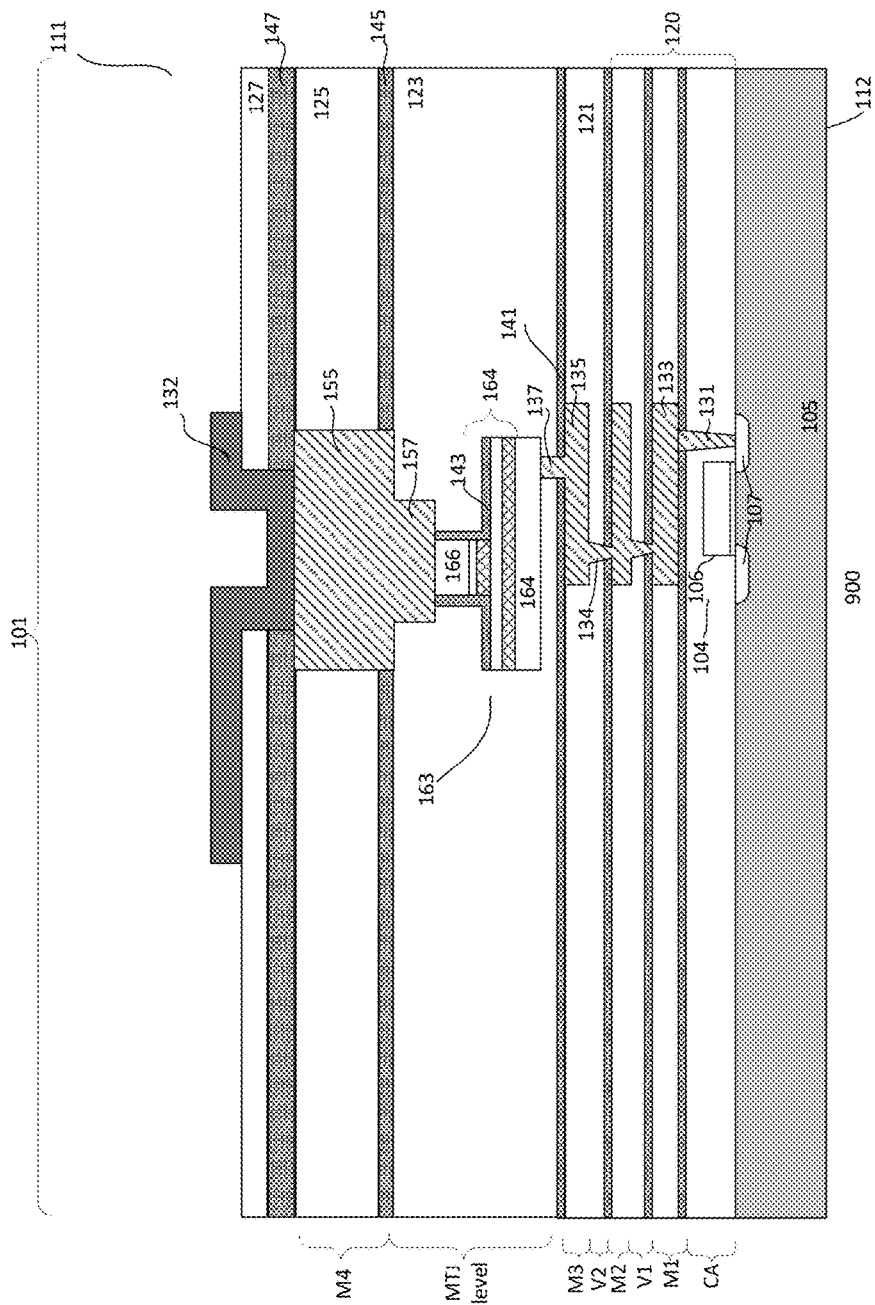
FIGS. 9a-9f show another exemplary embodiment of a process flow for forming front side magnetic shield and thick lateral magnetic shield in the prime die region of a MRAM wafer.

The process 900 differs from the process 700 in that the cross-sectional views of the process 900 illustrate only the prime die region 110 and the wafer level processing as will be described below are performed within the prime die region. Referring to FIG. 9a, the process 900 is at the stage similar to that described in FIG. 7a. As shown, the MTJ array is defined within the prime die region 110. For simplicity, only one MTJ bit from an array of MTJ bits is shown. The process 900 is at the stage of wafer level processing immediately after forming a pad level having a first pad dielectric layer 147 and a second pad dielectric layer 127 covering the metal line 155 in the uppermost upper ILD layer (e.g., M4). A pad interconnect having a pad via contact lining the pad via opening and a die bond pad 132 is disposed over the top surface of the second pad dielectric layer 127.

Figure 9B:
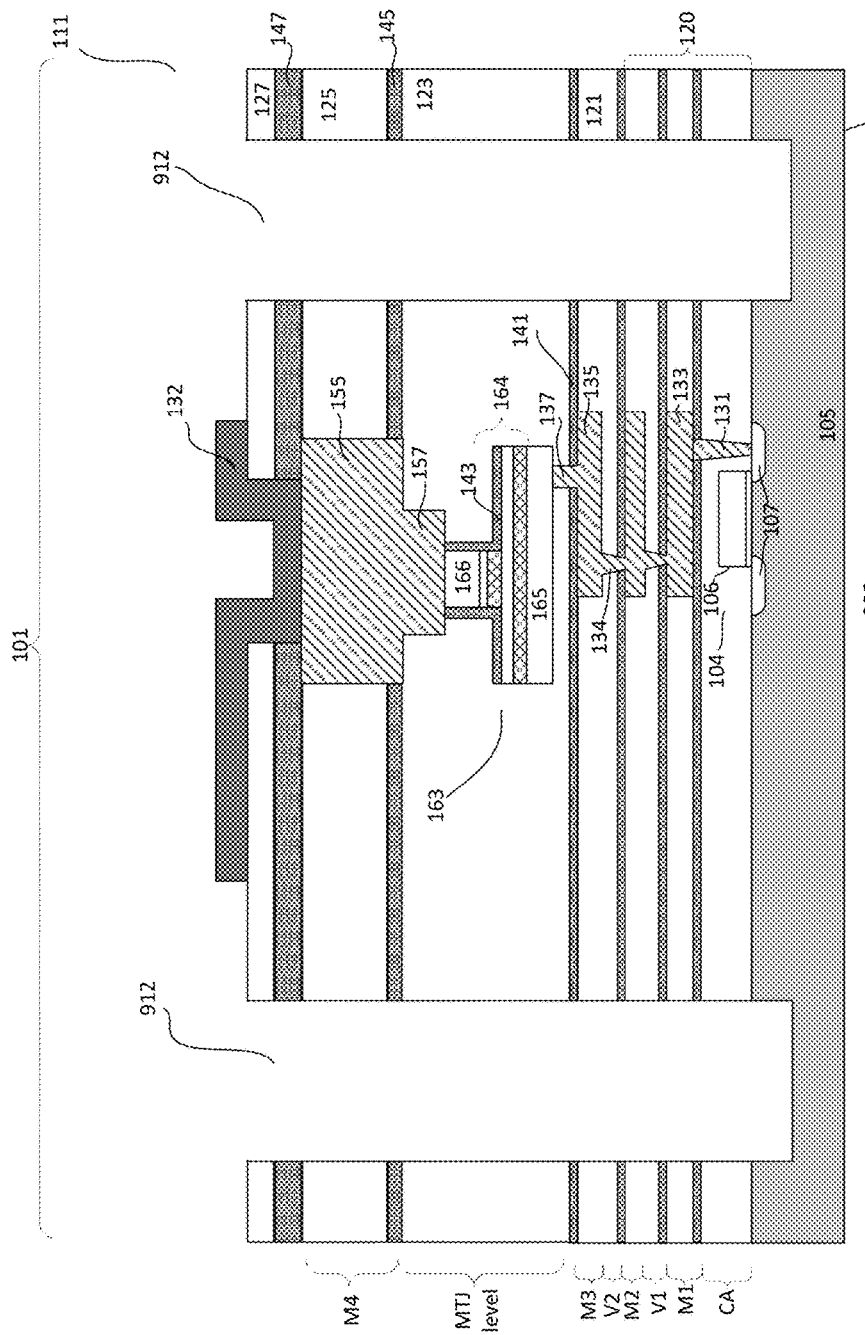

Referring to FIG. 9b, the process 900 continues by introducing deep trenches 912 through the wafer. In one embodiment, the deep trenches 912 are formed within the prime die region 101. The deep trenches, for example, are formed surrounding or adjacent to various sides of the magnetic storage element when viewed from top. In one embodiment, the deep trenches may be formed using DRIE or any suitable techniques. The etch process, for example, forms deep trenches 912 which extend partially into the substrate 105. In one embodiment, the deep trenches 912 extend from the top surface of the second pad dielectric layer 127 to within a portion of the substrate 105. The deep trenches extend to within the substrate and the bottom of the trenches terminate at a distance away from the bottom surface 112 of the substrate. The openings, for example, include a width of about 150 µm and a depth of about 100-200 µm. Other suitable width and depth dimensions may also be useful.

Figure 9C:
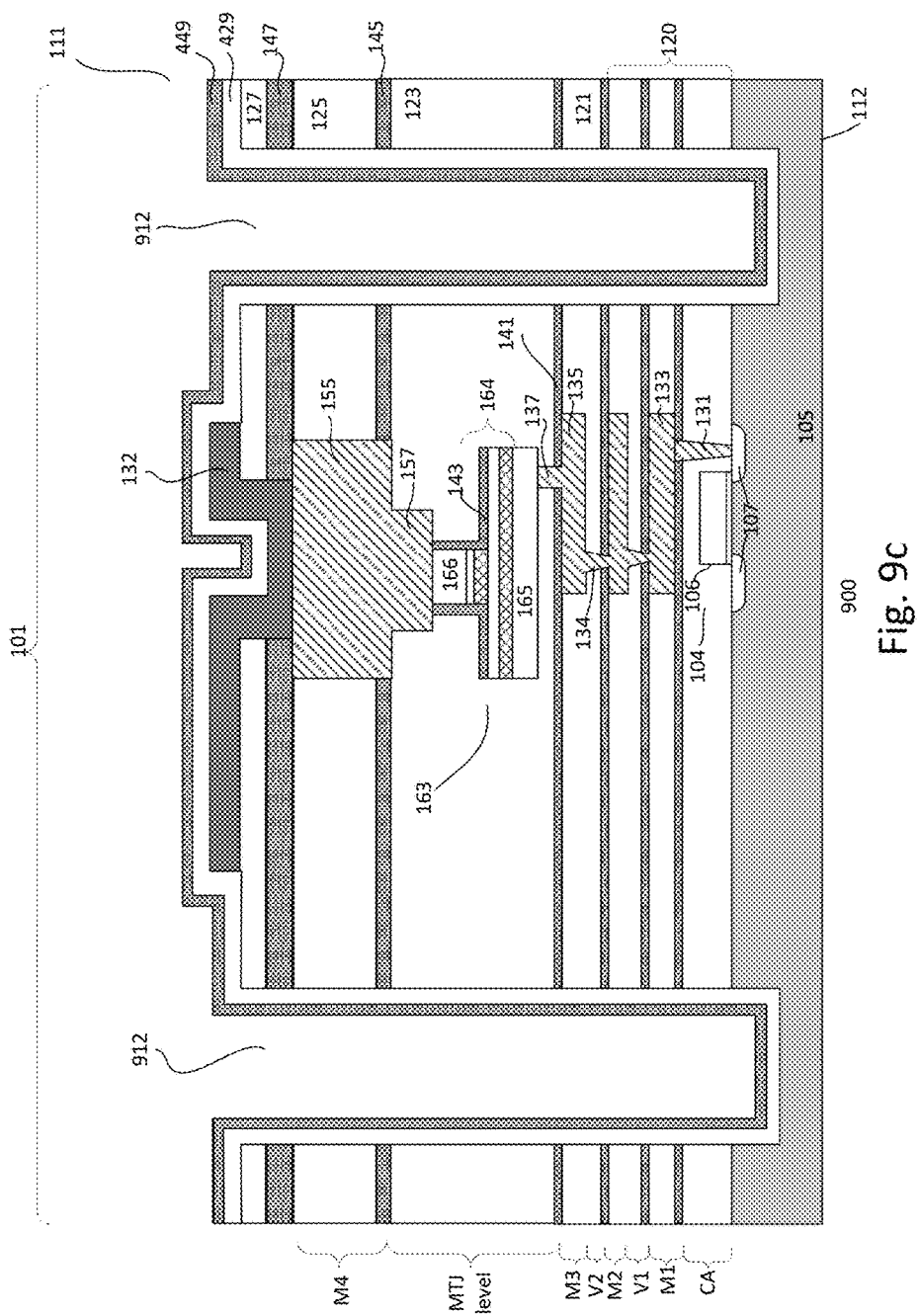

In FIG. 9c, the process 900 continues to form a passivation layer on the first surface (or front side) 111 of the wafer and sidewalls and bottom of the deep trenches 912 within the prime die region 110. Materials and techniques for forming the first and second passivation layers 429 and 449 are the same as that described in FIG. 7c.

Figure 9D:
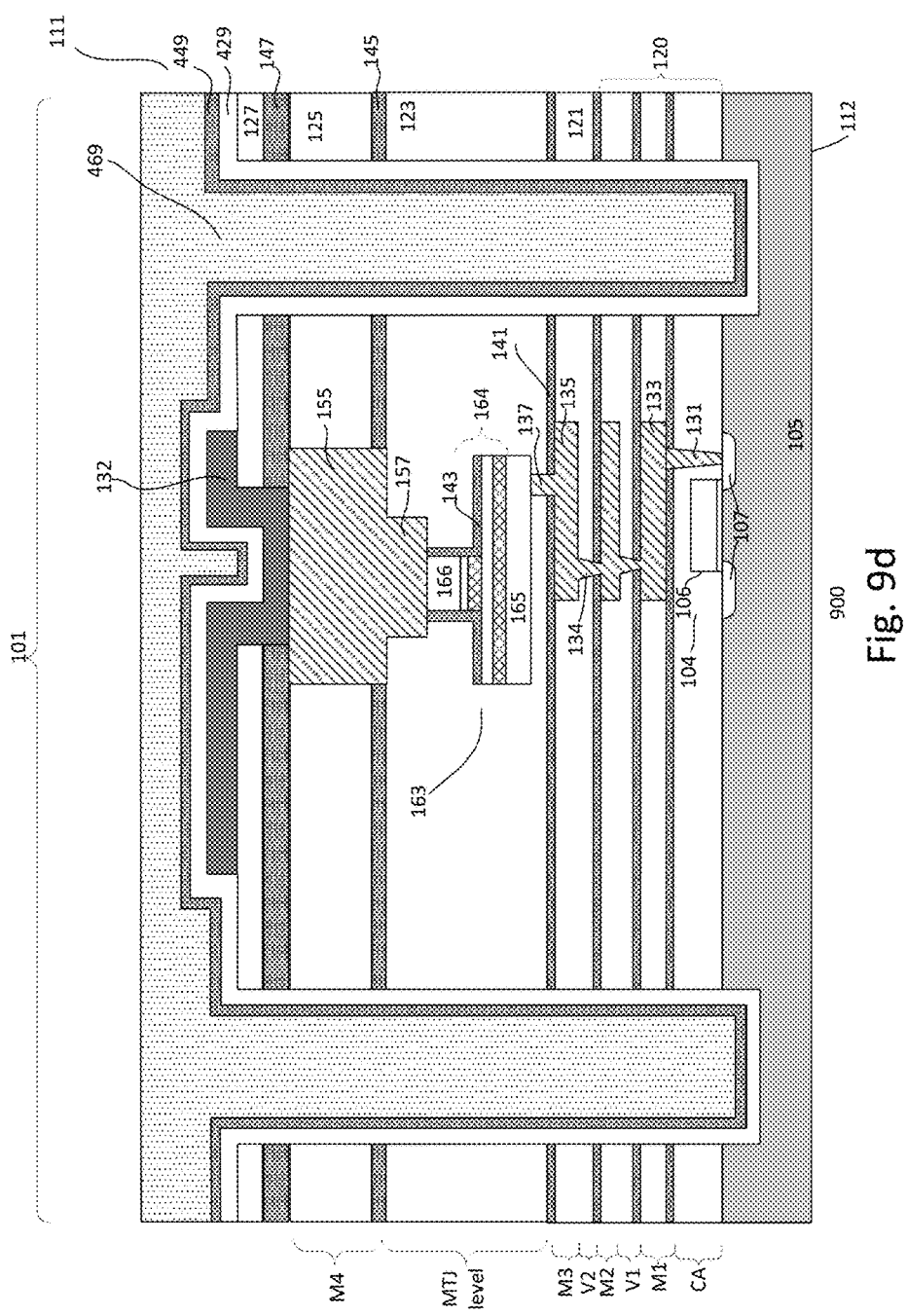
Figure 9E:
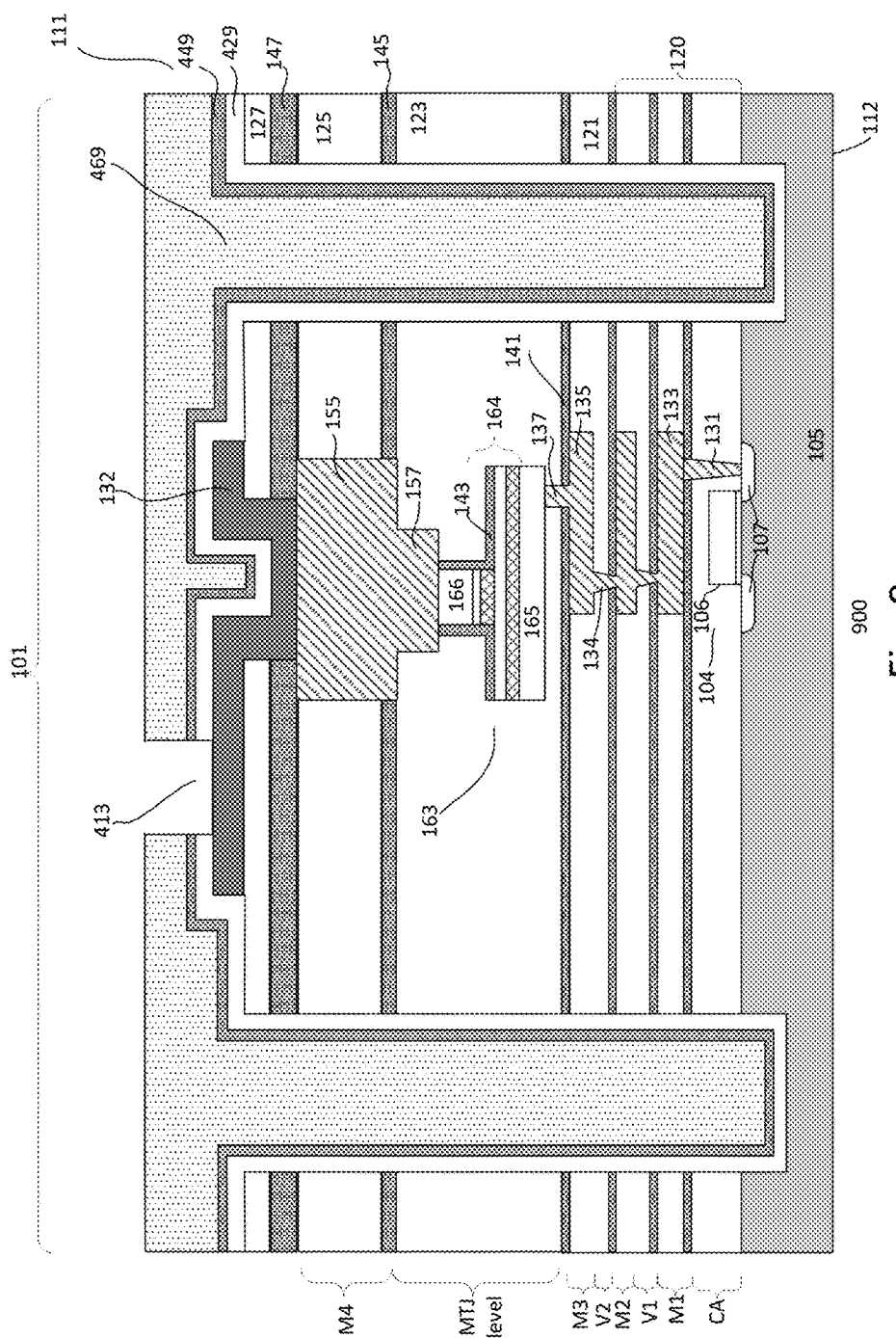

In one embodiment, the process 900 continues to form a magnetic shield layer 469 covering the passivation layers on the first surface 111 and completely fills the deep trenches 912 which are formed in the prime die region 110 as shown in FIG. 9d. The magnetic shield layer, for example, includes the same or suitable magnetic shield material as described in FIG. 7c. The magnetic shield layer, for example, may be formed by PVD or ECD with a thickness of about 150 µm. Excess magnetic shield material may be removed by a planarization process, such as chemical mechanical polishing (CMP). As shown, this forms a magnetic shield layer having a substantially planar top surface on the first surface 111 of the wafer. Other suitable forming techniques and thicknesses may also be useful.

Figure 9F:
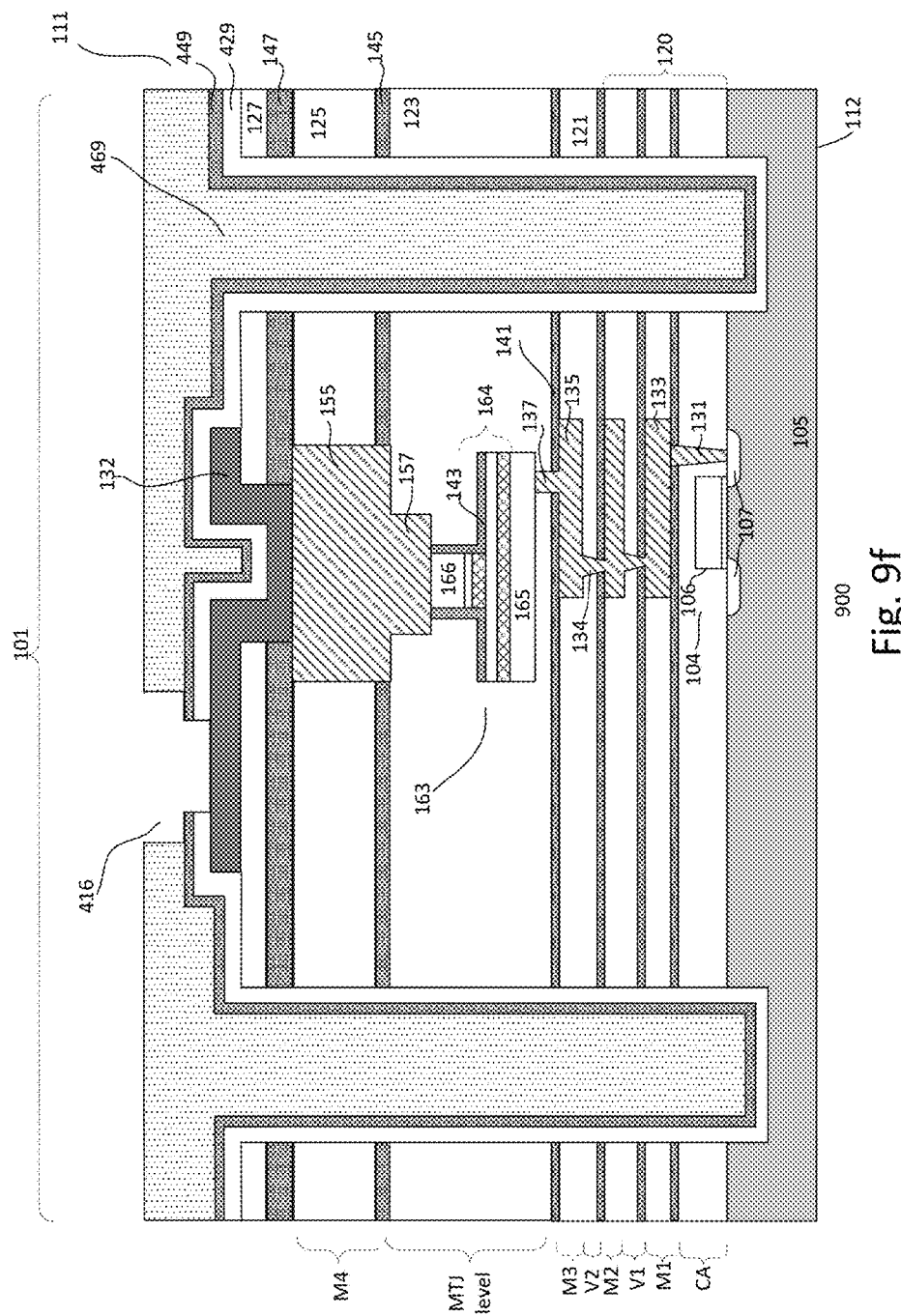

One or more die bond pad openings 413 are formed through the magnetic shield layer and the passivation layers, exposing a portion of die bond pad 132 in the pad level. To form the die bond pad opening, the magnetic shield and passivation layers may be patterned using suitable mask and etch techniques as described in FIG. 7e. As shown, the die bond pad opening 413 exposes underlying die bond pad for wire bonding to connect to exterior devices. Referring to FIG. 9f, the opening may also be enlarged by removing additional portion of the magnetic shield layer using suitable mask and etch technique to expose portions of the passivation nitride to form a die bump pad opening 416 described in FIG. 2b, which is configured for accommodating die microbumps for flip chip packaging.

The process 900 may continue by performing a singulation process. The singulation process may be performed using suitable technique as described in FIG. 7e. The singulation process, for example, singulates or separates the dies in a wafer format through the scribe/saw lane regions (not shown) to form individual MRAM chips or dies, such as that described and shown in FIG. 4b or 4c. As shown, the first surface (front side) of the die or chip and deep trenches adjacent to the magnetic storage element of the die are provided with front side and thick lateral magnetic shields. The relatively thick magnetic shield layer covering the front side of the die and within the deep trenches surrounding or adjacent to the MTJ array partially protects the MTJ bits from in-plane and perpendicular magnetic field interferences.

FIGS. 10a-10h illustrate another process 1000 for forming a MRAM chip or die. For illustration purpose, some of the figures may be presented as cross-sectional views while some of the figures may be presented as isometric views. The process 1000, for example, is similar to the process 900 as described in FIGS. 9a-9f and the MRAM chip or die formed by process 1000 is similar to the MRAM chip or die 500 as described in FIG. 5. Common elements, indicated by the same reference numerals, may not be described or described in detail. In the interest of brevity, the description of the process 1000 below primarily focuses on the difference(s) compared with the process 900.

Figure 10A:
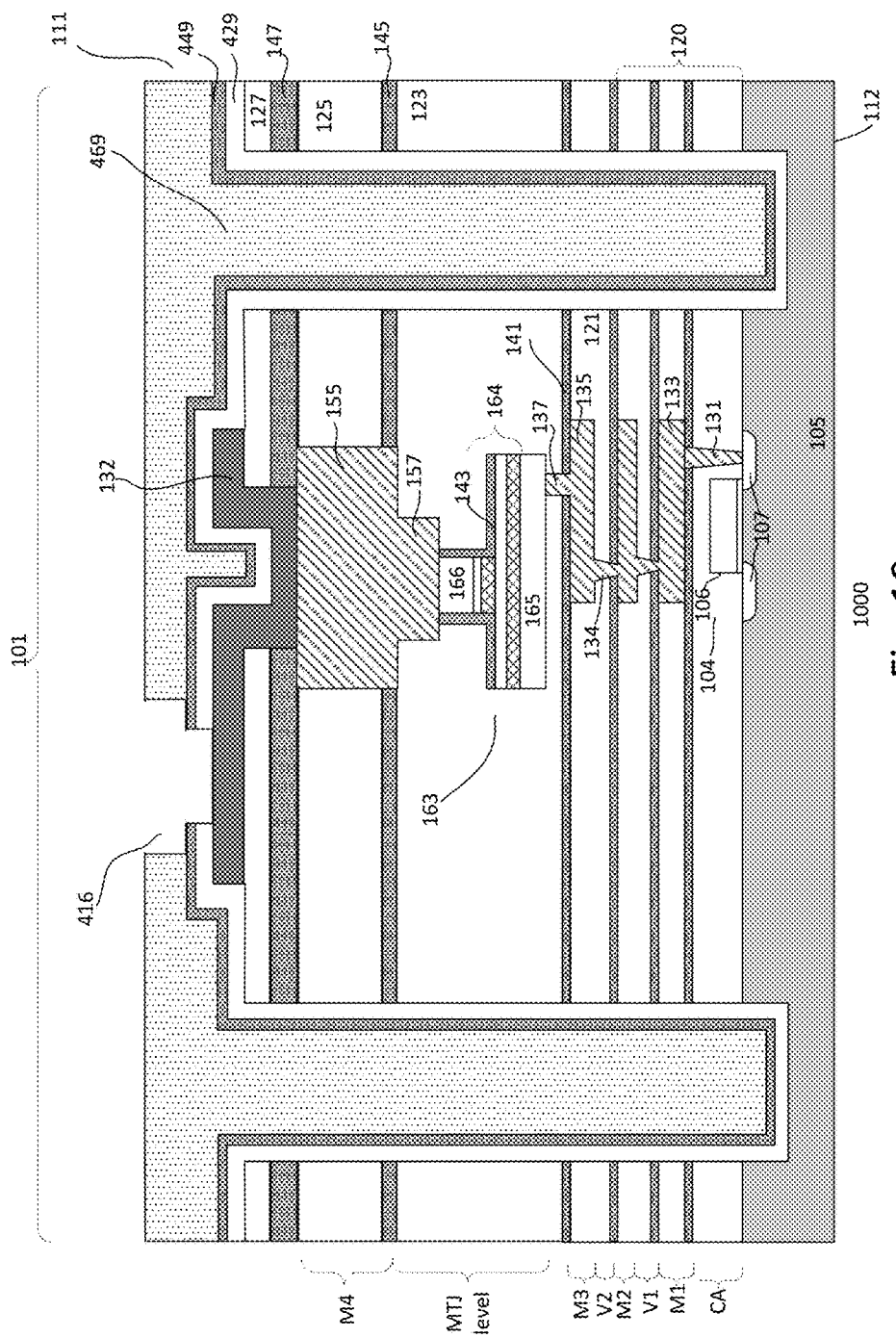
FIGS. 10a-10h show an exemplary embodiment of a process flow for forming front side magnetic shield, back side magnetic shield and thick lateral magnetic shield in the prime die region of a MRAM wafer.

Referring to FIG. 10a, the process 1000 is at the stage similar to that described in FIG. 9f. As shown, the process 1000 is at the stage of wafer level processing immediately after forming the magnetic shield layer 469 covering the front side 111 and completely fills the deep trenches surrounding or adjacent to the MTJ array and where one or more die bump pad openings 416 have been defined. For simplicity, only one MTJ bit from an array of MTJ bits is shown.

Figure 10C:
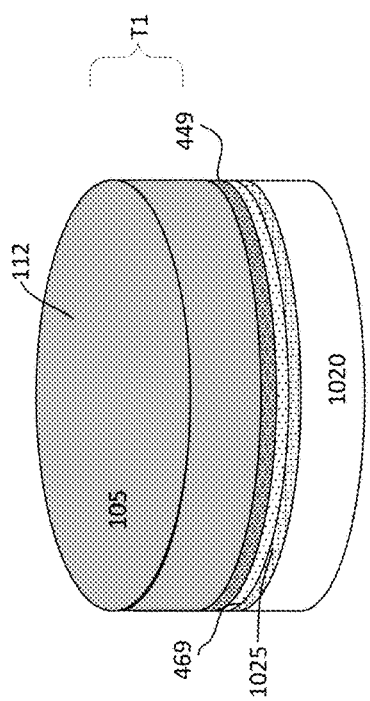
Figure 10B:
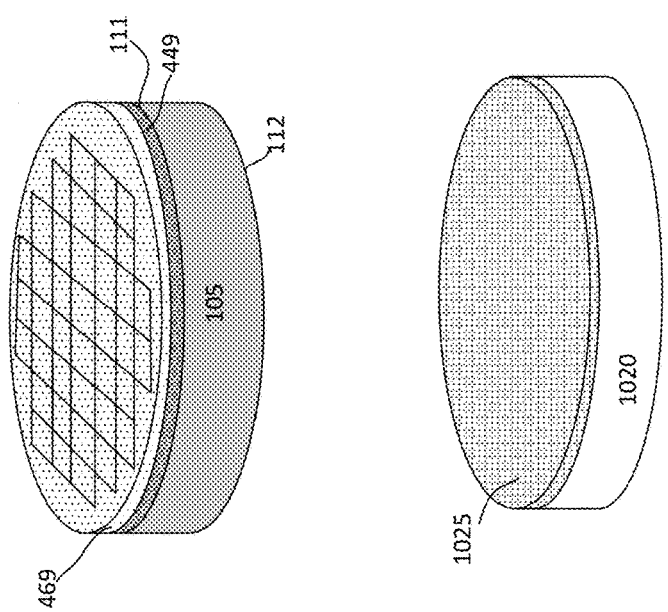

Referring to FIG. 10b, the process continues by providing a support carrier 1020 having top and bottom surfaces. The support carrier, for example, is a temporary carrier for processing the wafer as processed and as described in FIG. 10a. The carrier should be sufficiently rigid to serve as a temporary support and withstand further processing steps. By way of non-limiting example, the support carrier may be a silicon wafer, conductive tape, metallic plate or the like. Various types of materials may be used to serve as the support carrier.

In one embodiment, an adhesive layer 1025 is provided on the top surface of the support carrier. Other temporary bonding techniques may also be useful. The adhesive, for example, can be any type of adhesive that provides temporary bonding of the wafer as processed and as described in FIG. 10a to the support carrier. The adhesive may include any suitable material and may be in different form. For example, the adhesive includes a B-stage dielectric material in the form of a tape, liquid or paste. The adhesive may be provided on the support carrier using various techniques. The technique employed may depend on the type or form of the adhesive. For example, a tape adhesive may be provided on the support carrier by lamination, a paste adhesive may be provided on the support carrier by printing while a liquid adhesive may be provided on the substrate by spin coating or dispensing.

The wafer as processed and as described in FIG. 10a is flipped such that the front side (or active surface) 111 of the wafer faces the support carrier 1020 while the back side (or inactive surface) 112 of the wafer faces upward as shown in FIG. 10b. In one embodiment, the process continues by attaching and bonding the wafer to the support carrier. As shown in FIG. 10c, the wafer is temporarily bonded to the support carrier through the adhesive.

Figure 10E:
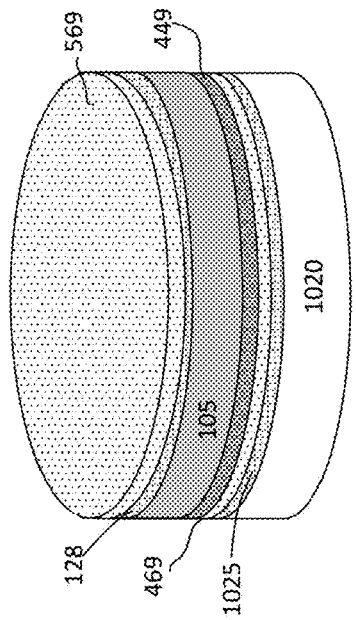
Figure 10D:
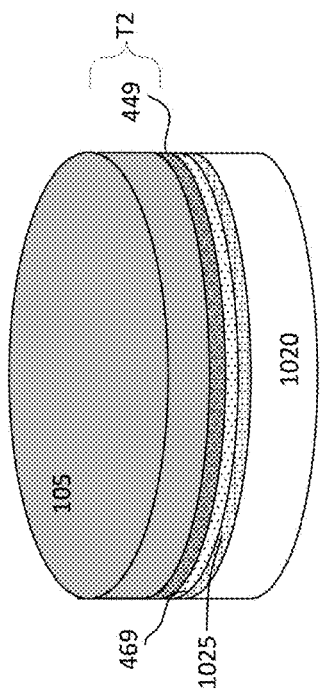

The process 1000 continues by removing a portion of the wafer substrate 105 as shown in FIG. 10d. In one embodiment, a portion of the wafer substrate is removed using a backgrinding process. A backgrinding process is then performed on the exposed back side (or inactive surface) 112 of the wafer. For example, the backgrinding process removes a portion of the wafer substrate and reduces the thickness of the wafer from an original thickness T1 to a reduced thickness T2. The thickness T2, for example, may be about 100-200 µm. Other suitable techniques to remove a portion of the wafer substrate and final thickness dimensions of the wafer substrate may also be useful.

In one embodiment, the process 1000 continues by depositing a dielectric layer 128 on the back side (or inactive surface) 112 of the thinned wafer as shown in FIG. 10e. The dielectric layer, for example, includes an adhesive or a silicon nitride layer. The adhesive or silicon nitride may be deposited by CVD. A plurality of openings may be formed through the dielectric layer by mask and etch techniques. For example, a patterned photoresist mask (not shown) may be formed over the dielectric layer, serving as an etch mask. An etch, such as RIE, may be used to pattern the dielectric layer with the patterned mask. The etch, for example, removes exposed portions of the dielectric layer to form openings exposing portions of the magnetic shield layer 469 in the deep trenches. The process 1000 continues by forming a magnetic shield layer 569 on the back side of the wafer substrate 105 having the dielectric layer 128 as shown in FIG. 10e. The magnetic shield layer 569 includes the same material as described for the magnetic shield layer 469 and is formed by PVD or ECD over the dielectric layer 128 and fills the openings in the dielectric layer. The magnetic shield layer 569 covers the second surface (inactive surface/back side) of the dies or chips processed in wafer format on the wafer. The magnetic shield layer 569 formed on the second surface (back side) 112 of the die protects the sensitive MTJ array from external magnetic field.

Figure 10G:
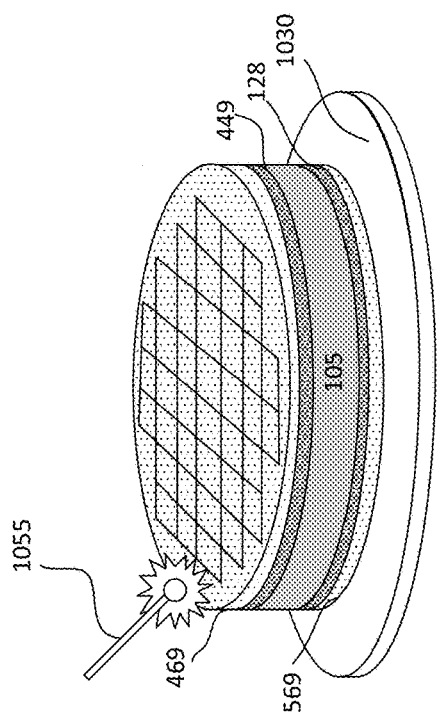
Figure 10F:
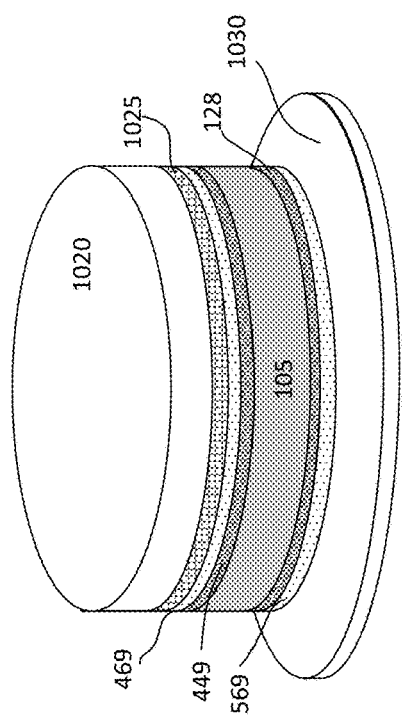

As shown in FIG. 10f, the wafer is provided on a support unit. The support unit, for example, includes a carrier tape or dicing tape 1030. Other suitable types of support unit which is sufficiently strong to provide temporary support may also be useful. The wafer is placed on the top surface of the dicing tape such that the second (or inactive) surface of the wafer 112 having the magnetic shield layer 569 contacts the top surface of the dicing tape while the first (or active) surface 111 of the wafer having the magnetic shield layer 469 is away from the dicing tape. In one embodiment, a debonding treatment is performed. The debonding treatment may, for example, cause the adhesive over the support carrier to lose or reduce its adhesive strength to allow separation of the wafer from the support carrier. The debonding treatment, for example, includes a temperature or heat treatment. Other suitable types of debonding treatments may also be useful. The debonding treatment may depend on the type of adhesive used. The debonding treatment may include chemical treatment, such as applying a solvent to dissolve the adhesive, or a mechanical treatment, such as pulling or twisting, to separate the wafer from the support carrier.

Referring to FIG. 10g, the removal of the support carrier exposes front side (or active surface) 111 of the wafer having the magnetic shield layer 469. The process 1000 continues by performing a singulation process. The singulation process may be performed using suitable technique as described in FIG. 7e. The singulation process, for example, singulates or separates the dies or chips in a wafer format through the scribe/saw lane regions to form individual MRAM chips or dies, such as that described and shown in FIG. 5.

Figure 10H:
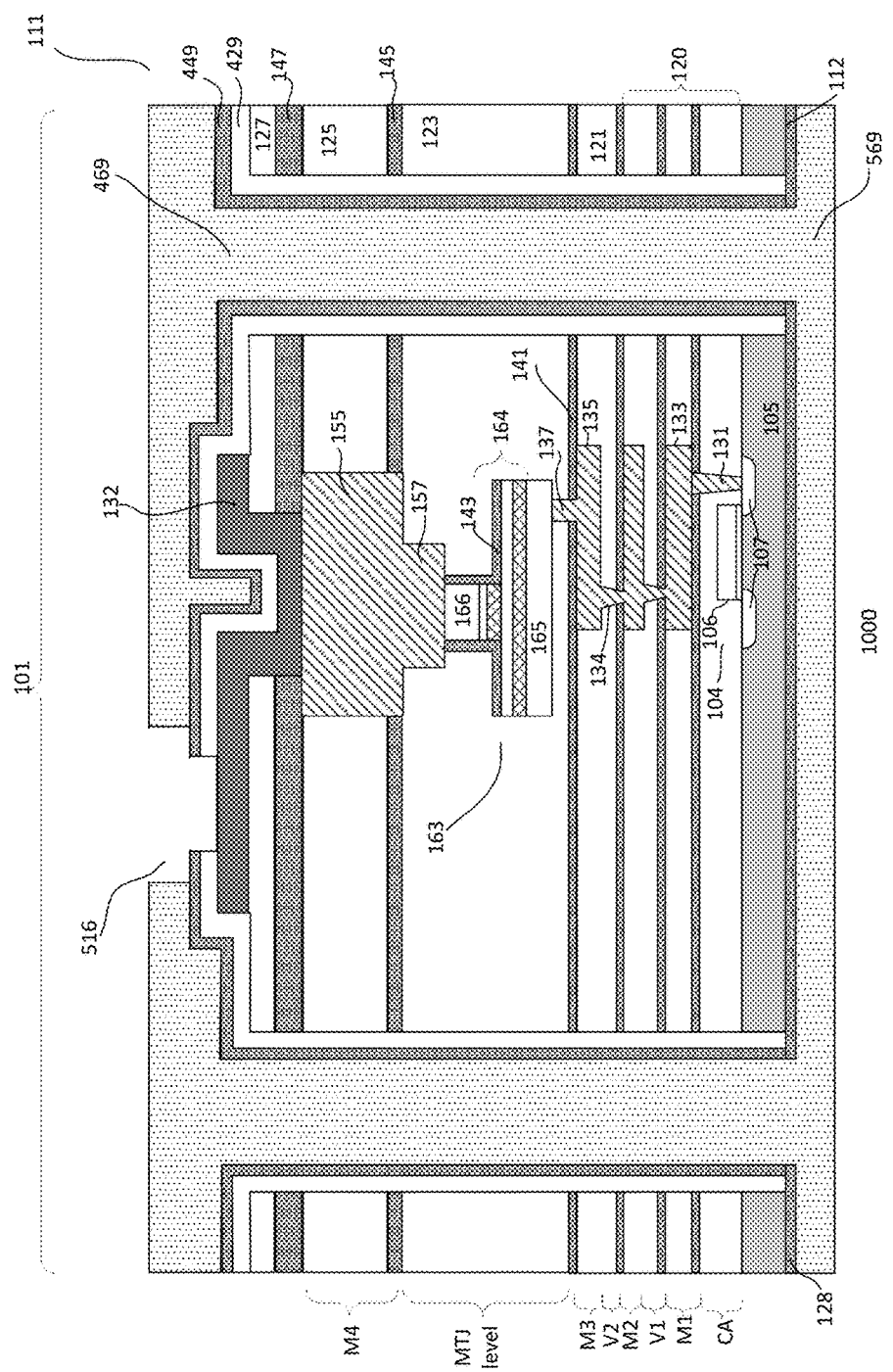

FIG. 10h shows a cross-sectional view of the singulated MRAM chip or die. As shown, the first surface (front side) 111 of the die or chips and deep trenches surrounding or adjacent to the MTJ array of the die are provided with front side and thick lateral magnetic shields. The relatively thick magnetic shield layer 469 covering the active surface of the die and within the deep trenches surrounding or adjacent to the MTJ array protects the MTJ bits from in-plane and perpendicular magnetic field interferences. For simplicity, only one MTJ bit from an array of MTJ bits is shown. In addition, the second surface (back side) 112 of the die is also covered by a magnetic shield layer 569. The deep trenches filled with magnetic shield layer connect front side magnetic shield with back side magnetic shield. Thus, the front side, back side and lateral/vertical shields of the MRAM die protect the MTJ array from external in-plane and perpendicular magnetic field interferences.

The embodiments as described in this disclosure result in various advantages. For example, the MRAM chips or dies as described have magnetic shield materials disposed on different locations of the MRAM chip such as back side, front side, sidewalls of the chip, and/or lateral sides surrounding or adjacent to the MTJ array within the chip. One or more magnetic shield dispositions and different combinations of the dispositions may be contemplated herein. Furthermore, the disclosed methods protect the MTJ array of the MRAM chips or dies from global external magnetic fields. These methods of forming the MRAM chips are easy in fabrication and are highly compatible with complementary metal oxide semiconductor (CMOS) process flow. The cycle time is lower compared to individual die-packaging level magnetic shielding. The process may be performed without requiring additional or new manufacture tooling.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a magnetic random access memory (MRAM) chip comprising:
    providing a substrate having first and second surfaces, wherein the first surface is defined with a prime die region and the second surface of the substrate defines a back side of the MRAM chip;
    forming an upper interlevel dielectric (ILD) layer over the first surface of the substrate, wherein the upper ILD layer comprises a plurality of ILD levels;
    forming a magnetic storage element having a magnetic tunneling junction (MTJ) array with MTJ stack in the prime die region and in between adjacent ILD levels of the upper ILD layer;
    forming a pad level over the magnetic storage element, wherein the pad level comprises a die bond/bump pad coupled to the magnetic storage element and the pad level defines a front side of the MRAM chip;
    forming deep trenches surrounding or adjacent to the MTJ array within the prime die region, wherein the deep trenches extend from a top surface of the pad level and partially into a portion of the substrate;
    forming a passivation layer covering the pad level and lining sidewalls and bottom of the deep trenches; and
    forming a magnetic shield layer over at least a portion of the front side and sidewalls of the MRAM chip, wherein the magnetic shield layer covers at least a portion of the passivation layer over the pad level.

2. The method of claim 1 comprising forming the passivation layer covering the sidewalls of the MRAM chip, wherein the magnetic shield layer further covers the sidewalls of the MRAM chip.

3. The method of claim 1 wherein the magnetic shield layer covers the passivation layer over the pad level and fills the deep trenches.

4. The method of claim 3 comprising forming a back side magnetic shield layer over the back side of the MRAM chip.

5. A method of forming a magnetic random access memory (MRAM) chip comprising:
    providing a substrate having first and second surfaces, wherein the first surface is defined with a prime die region and the second surface of the substrate defines a back side of the MRAM chip;
    forming an upper inter level dielectric (ILD) layer over the first surface of the substrate, wherein the upper ILD layer comprises a plurality of ILD levels;
    forming a magnetic storage element having a magnetic tunneling junction (MTJ) array with MTJ stack in the prime die region and in between adjacent ILD levels of the upper ILD layer;
    forming a pad level over the magnetic storage element, wherein the pad level comprises a die bond/bump pad coupled to the magnetic storage element and the pad level defines a front side of the MRAM chip;
    forming a passivation layer covering the pad level and sidewalls of the MRAM chip; and
    forming at least a front side magnetic shield layer over at least a portion of the front side of the MRAM chip, wherein the magnetic shield layer covers the passivation layer over the pad level and sidewalls of the MRAM chip.

6. The method of claim 5 comprising forming a die bond/bump pad opening through a portion of the magnetic shield layer and the passivation layer over the front side of the MRAM chip and exposes a portion of the underlying die bond/bump pad of the pad level.

7. A method of forming a magnetic random access memory (MRAM) chip comprising:
    providing a substrate having first and second surfaces, wherein the first surface is defined with a prime die region and the second surface of the substrate defines a back side of the MRAM chip;
    forming an upper interlevel dielectric (ILD) layer over the first surface of the substrate, wherein the upper ILD layer comprises a plurality of ILD levels;
    forming a magnetic storage element having a magnetic tunneling junction (MTJ) array with MTJ stack in the prime die region and in between adjacent ILD levels of the upper ILD layer;
    forming a pad level over the magnetic storage element, wherein the pad level comprises a die bond/bump pad coupled to the magnetic storage element and the pad level defines a front side of the MRAM chip;
    forming a passivation layer covering the pad level and sidewalls of the MRAM chip; and
    forming a magnetic shield layer over at least a portion of the front side and the sidewalls of the MRAM chip, wherein the magnetic shield layer covers at least a portion of the passivation layer over the pad level and further covers the sidewalls of the MRAM chip, wherein the front side magnetic shield layer is in the form of magnetic shield spacers formed over vertical portions of the passivation layer while horizontal portions of the passivation layer are devoid of the magnetic shield spacers.

8. A method for forming a magnetic random access memory (MRAM) chip comprising:
  providing a wafer having a wafer substrate with first and second surfaces, wherein the first surface of the wafer substrate is defined with prime die regions and scribe/saw lane regions surrounding the prime die regions, and the second surface of the wafer substrate defines a back side of the wafer substrate; and
  processing the wafer, wherein processing the wafer comprises performing back end of line processing to form an upper interlevel dielectric (ILD) layer over the first surface of the wafer substrate, wherein the upper ILD layer comprises a plurality of ILD levels, forming one or more magnetic storage elements having a magnetic tunneling junction (MTJ) array with MTJ stack in the prime die regions and in between adjacent ILD levels of the upper ILD layer,
  forming a pad level over the one or more magnetic storage elements, wherein the pad level comprises a die bond/bump pad coupled to the one or more magnetic storage elements and the pad level defines a front side of the wafer,
  performing a first singulation process through the scribe regions of the wafer to form openings in the scribe/saw lane regions which extend from a top surface of the pad level to within a portion of the wafer,
  forming a passivation layer covering the pad level, wherein the passivation layer lines sidewalls and bottom of the openings in the scribe/saw lane region,
  forming a magnetic shield layer over at least a portion of the front side of the wafer, wherein the magnetic shield layer covers at least a portion of the passivation layer over the pad level, and
  separating the wafer into a plurality of individual MRAM chips, wherein an individual MRAM chip comprises first and second sidewalls and a front side, wherein the magnetic shield layer is disposed over at least a portion of the front side and the first and second sidewalls of the MRAM chip.

9. The method of claim 8 wherein the magnetic shield layer covers the passivation layer over the pad level and lines the passivation layer over the sidewalls and bottom of the openings in the scribe/saw lane regions.

10. The method of claim 9 wherein separating the wafer into a plurality of individual MRAM chips is performed through a second singulation process, wherein the sidewalls of the openings in the scribed/saw lane regions define the first and second sidewalls of the MRAM chip and the magnetic shield layer covers the passivation layer over the pad level and the first and second sidewalls of the MRAM chip.

11. The method of claim 9 wherein processing the wafer comprises performing a blanket etch process to remove horizontal portions of the magnetic shield layer, leaving vertical portions of the magnetic shield layer in a form of magnetic shield spacers lining sidewalls of the openings in the scribe/saw lane regions and vertical portions of the passivation layer.

12. A magnetic random access memory (MRAM) chip comprising:
  a substrate having first and second surfaces, wherein the first surface is defined with a prime die region and the second surface of the substrate defines a back side of the MRAM chip;
  an upper inter level dielectric (ILD) layer disposed over the first surface of the substrate, wherein the upper ILD layer comprises a plurality of ILD levels;
  a magnetic storage element having a magnetic tunneling junction (MTJ) array with MTJ stack disposed in the prime die region and in between adjacent ILD levels of the upper ILD layer;
  a pad level disposed over the magnetic storage element, wherein the pad level comprises a die bond/bump pad coupled to the magnetic storage element and the pad level defines a front side of the MRAM chip;
  a passivation layer covering the pad level and sidewalls of the MRAM chip; and
  at least a front side magnetic shield layer disposed over at least a portion of the front side of the MRAM chip, wherein the front side magnetic shield layer covers the passivation layer over the pad level and the sidewalls of the MRAM chip.

13. The MRAM chip of claim 12 wherein the front side magnetic shield layer is in a form of magnetic shield spacers disposed over vertical portions of the passivation layer while horizontal portions of the passivation layer are devoid of the magnetic shield spacers.

14. The MRAM chip of claim 12 comprising:
  deep trenches surrounding or adjacent to the MTJ array within the prime die region, wherein the deep trenches extend from a top surface of the pad level and partially into a portion of the substrate; and
  the passivation layer covering the pad level and lining sidewalls and bottom of the deep trenches.

15. The MRAM chip of claim 14 wherein the front side magnetic shield layer covers the passivation layer over the pad level and fills the deep trenches.

16. The MRAM chip of claim 15 comprising a back side magnetic shield layer disposed over the back side of the MRAM chip.

* * * * *